(12) United States Patent
Matsuzaki et al.

(10) Patent No.: US 11,849,260 B2
(45) Date of Patent: Dec. 19, 2023

(54) OPERATION MANAGEMENT DEVICE, OPERATION MANAGEMENT METHOD, AND NON-TRANSITORY COMPUTER-READABLE STORAGE MEDIUM

(71) Applicant: HAKKO CORPORATION, Osaka (JP)

(72) Inventors: Kenji Matsuzaki, Osaka (JP); Kenta Nakamura, Osaka (JP); Hitoshi Takeuchi, Osaka (JP); Kosho Karino, Osaka (JP)

(73) Assignee: HAKKO CORPORATION, Osaka (JP)

( * ) Notice: Subject to any disclaimer, the term of this patent is extended or adjusted under 35 U.S.C. 154(b) by 0 days.

(21) Appl. No.: 17/690,885

(22) Filed: Mar. 9, 2022

(65) Prior Publication Data

US 2022/0201255 A1  Jun. 23, 2022

Related U.S. Application Data

(63) Continuation of application No. PCT/JP2020/033725, filed on Sep. 7, 2020.
(Continued)

(51) Int. Cl.
    H04N 7/18  (2006.01)
(52) U.S. Cl.
    CPC .................. H04N 7/183 (2013.01)
(58) Field of Classification Search
    CPC ........ H05K 13/08; H05K 13/00; H04N 7/183; B23K 1/00
    See application file for complete search history.

(56) References Cited

U.S. PATENT DOCUMENTS 5,140,730 A * 8/1992 Maskens ............ H05K 13/0473
                                                29/33 M
5,542,600 A * 8/1996 Kobayashi ....... G05B 19/41885
                                                228/103
(Continued)

FOREIGN PATENT DOCUMENTS

| JP | H03-088340 A  | 9/1991 |
| JP | 2018-114524 A | 7/2018 |
| JP | 2019-056622 A | 4/2019 |

OTHER PUBLICATIONS

Patent Cooperation Treaty, International Search Report, Application No. PCT/JP2020/033725, dated Nov. 6, 2020, in 5 pages.
(Continued)

*Primary Examiner* — Kathleen V Nguyen
(74) *Attorney, Agent, or Firm* — Procopio, Cory, Hargreaves & Savitch LLP

(57) ABSTRACT

A work management apparatus, a work management method, and a non-transitory computer-readable storage medium storing a control program for managing a plurality of soldering works to be manually performed on a board, include: storing, in association with identification information of the board acquired by an identification information acquisition device connected to the work management apparatus, captured images of an entirety of the board and monitor information being chronologically continuous and respectively acquired by an image-capturing device and a soldering monitor device each connected to the work management apparatus in the soldering works; and chronologically displaying each of the captured images and monitor information stored in association with one piece of identification information selected from among the stored identification information of the board in a state where a capturing date and time of the captured image and an acquisition date and time of the monitor information match.

15 Claims, 13 Drawing Sheets

Related U.S. Application Data

(60) Provisional application No. 62/898,302, filed on Sep. 10, 2019.

(56) References Cited

U.S. PATENT DOCUMENTS

| | | | |
|---|---|---|---|
| 7,167,768 B2 * | 1/2007 | Kato | G05B 19/409 |
| | | | 700/121 |
| 2018/0200819 A1 * | 7/2018 | Teraoka | B23K 3/03 |

OTHER PUBLICATIONS

Patent Cooperation Treaty, ISA, Application No. PCT/JP2020/033725, dated Nov. 6, 2020, in 4 pages.

* cited by examiner

OPERATION MANAGEMENT DEVICE, OPERATION MANAGEMENT METHOD, AND NON-TRANSITORY COMPUTER-READABLE STORAGE MEDIUM

CROSS-REFERENCE TO RELATED APPLICATION

This is a continuation application of International Application No. PCT/JP2020/033725 filed on Sep. 7, 2020 which claims the benefit of priority from U.S. application No. 62/898,302 filed on Sep. 10, 2019. The entire contents of the earlier applications are incorporated herein by reference.

TECHNICAL FIELD

The present disclosure relates to a work management apparatus, a work management method, and a non-transitory computer-readable storage medium storing a control program for each managing a plurality of soldering works to be manually performed on a board.

BACKGROUND

JP-A-2019-056622 discloses a technology of determining whether an abnormal location is present in a joining portion when an operator heats a joining subject member by a gas burner and performs a joining operation through brazing.

Specifically, the technology disclosed in JP-A-2019-056622 includes acquiring, as joining phenomenon data, images of a brazing flow and a temperature distribution at a joining location in the joining operation by the operator. A distance from the joining location to a brazing holding hand of the operator, and a movement of the gas burner at the joining location are acquired as operation state data. Then, a data range corresponding to the joining location is extracted from evaluation data in which the joining phenomenon data and the operation state data are associated with each other in time series, and it is determined, based on a result of comparison between the data range and a predetermined reference data, whether the joining location has an abnormality.

However, in the technology disclosed in JP-A-2019-056622, not images of the brazing flow and the temperature distribution for an entirety of the joining subject member, but images of those only for the joining location that is a part of the joining subject member is acquired as the joining phenomenon data. Therefore, an appropriate joining location in the joining subject member is ungraspable from the joining phenomenon data. It is said from this perspective that the technology disclosed in JP-A-2019-056622 faces difficulty in ensuring traceability of a position in the joining subject member where the joining operation is performed.

SUMMARY

An object of the present disclosure is to improve traceability of a plurality of soldering works to be manually performed on a board.

A work management apparatus, a work management method, and a non-transitory computer-readable storage medium storing a control program according to the present disclosure respectively relate to a work management apparatus, a work management method, and a non-transitory computer-readable storage medium storing a control program for each managing a plurality of soldering works to be manually performed on a board, and include: storing, in association with identification information of the board acquired by an identification information acquisition device connected to the work management apparatus, captured images of an entirety of the board and monitor information being chronologically continuous and respectively acquired by an image-capturing device and a soldering monitor device each connected to the work management apparatus in the soldering works; and chronologically displaying each of the captured images and monitor information stored in association with one piece of identification information selected from among the stored identification information of the board in a state where a capturing date and time of the captured image and an acquisition date and time of the monitor information match.

The object, features, and advantages of the present disclosure will be further clarified by the following detailed description and the accompanying drawings.

DETAILED DESCRIPTION

Hereinafter, embodiments of the present disclosure will be described with reference to the accompanying drawings. It should be noted that each of the following embodiments illustrates one example of the invention, and does not delimit the technical protection scope of the present disclosure.

First Embodiment

Figure 1:
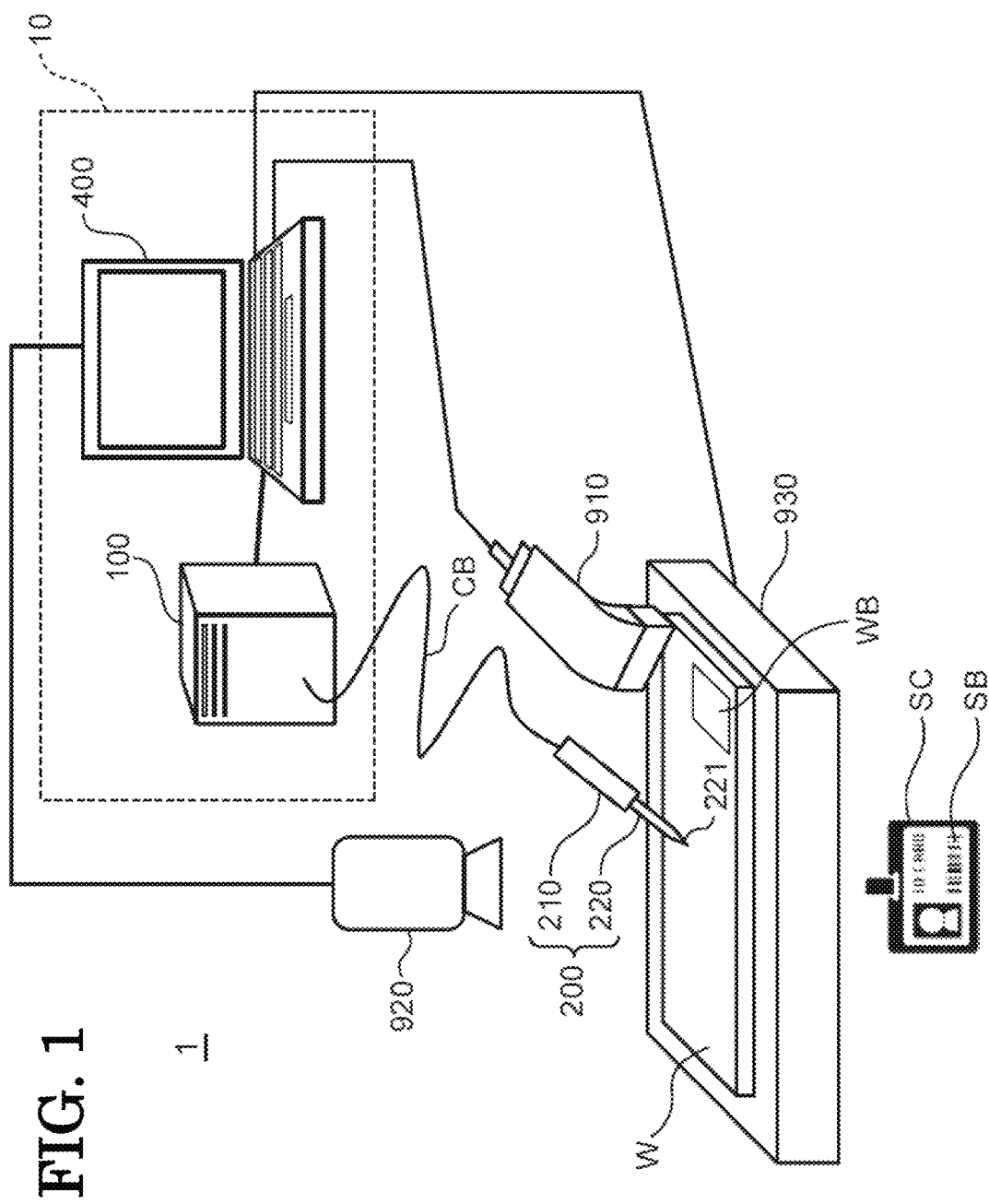
FIG. 1 shows an overall configuration of a work management system in a first embodiment.

FIG. 1 shows an overall configuration of a work management system 1 in a first embodiment. The work management system 1 is a system for managing a plurality of soldering works to be manually performed on a board W. The work management system 1 includes a barcode reader 910 (an identification information acquisition device, a worker information acquisition device), a camera 920 (an image-capturing device), a switch-attached jig 930, and a work management apparatus 10.

The barcode reader 910 is connected to the work management apparatus 10 by a communication cable and is configured and adaptable to perform a wired communication with the work management apparatus 10. The barcode reader 910 reads (acquires) board information about a board W represented by a barcode WB applied or printed onto the board W, and transmits the read board information to the work management apparatus 10.

The board information contains identification information of the board W and soldering information about the soldering works to be performed on the board W. The soldering information contains information representing a shape of a tool tip suitable for each of the soldering works on the board W. The barcode WB may be applied or printed onto a casing for accommodating the board W or a packaging material for packaging the board W.

The barcode reader 910 reads (acquires) identification information of the worker represented by a barcode SB applied or printed onto an ID card SC of the worker who performs the soldering works on the board W, and transmits the read identification information of the worker to the work management apparatus 10. The barcode reader 910 may be configured to perform a wireless communication with the work management apparatus 10. In this case, the barcode reader 910 is movable in a wider range depending on the worker for the soldering works.

A two-dimensional code, such as a QR code (registered trademark), representing the board information may be applied or printed onto the board W. Similarly, a two-dimensional code representing the identification information of the worker may be applied or printed onto the ID card SC. In this case, the work management system 1 may include a two-dimensional code reader which can perform a wired or wireless communication with the work management apparatus 10.

The camera 920 is connected to the work management apparatus 10 by a communication cable, and is configured and adaptable to perform a wired communication with the work management apparatus 10. The camera 920 is supported by, for example, an unillustrated support member above the switch-attached jig 930 on which the board W is mounted.

The camera 920 continuously and chronologically captures images of an entirety of the board W in a predetermined image-capturing period (e.g., 0.1 seconds). The camera 920 transmits, to the work management apparatus 10, each of the captured images of the entirety of the board W that are chronologically continuous and obtained through the image-capturing. The captured image may be a video image or one of still images (frame images) being chronologically continuous in the image-capturing period. The camera 920 may be configured and adaptable to perform a wireless communication with the work management apparatus 10.

The switch-attached jig 930 is connected to the work management apparatus 10 by a communication cable, and is configured and adaptable to perform a wired communication with the work management apparatus 10. The switch-attached jig 930 has a mount surface on which the board W is mounted and a proximity sensor. When detecting a presence of the board W within a predetermined distance from the mount surface, the proximity sensor transmits a signal indicating the detection to the work management apparatus 10. The switch-attached jig 930 may be configured and adaptable to perform a wireless communication with the work management apparatus 10.

The work management apparatus 10 is an apparatus for managing the soldering works to be manually performed on the board W. The work management apparatus 10 includes a soldering tool control device 100 (soldering monitor device) and a computer 400.

The soldering tool control device 100 is connected to a soldering tool (iron) 200 by a cable CB. Thus, the soldering tool control device 100 is provided independently of the soldering tool 200, but is electrically connectable to the soldering tool 200. The soldering tool control device 100 has operability of controlling a temperature of a tool tip 221.

The soldering tool 200 is used for each soldering work. Specifically, the soldering tool 200 includes a handle 210 and a cartridge 220. The cartridge 220 is configured to be attachable to and detachable from the handle 210. The cartridge 220 has a tip serving as the tool tip 221.

The soldering work is not limited to a work of depositing solder melted by the soldering tool 200 onto the board W. The soldering work includes melting the solder deposited on the board W by the soldering tool 200 for sucking the solder. The soldering tool 200 used with the aim of melting and sucking the solder is called a solder sucker. The soldering work further includes melting the solder deposited on an electronic component soldered to the board W by using the soldering tool 200 to detach the electronic component from the board W. The soldering tool 200 used with the aim of melting the solder in this manner is called "Hot Tweezers".

The computer 400 is connected to the soldering tool control device 100 to enable a wired or wireless communication therewith. The computer 400 is, for example, a personal computer, such as a desktop computer, a laptop computer, and a tablet-type computer, or a smart phone. The computer 400 has operability of collecting information stored in a non-volatile memory 224 (FIG. 2) included in the cartridge 220, operability of managing the soldering works to be manually performed on the board W, and other operability.

Figure 2:
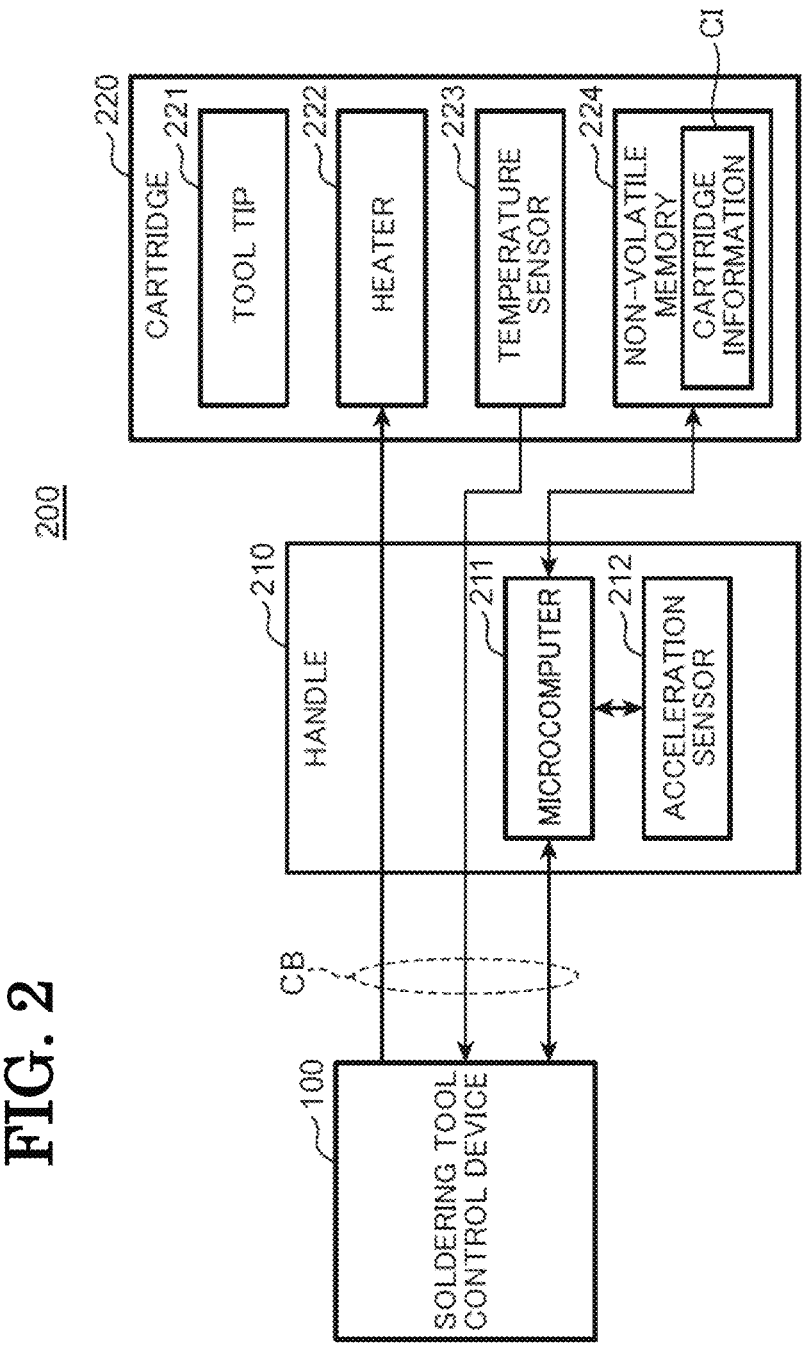
FIG. 2 is a block diagram showing an electric configuration of a soldering tool.

FIG. 2 is a block diagram showing an electric configuration of the soldering tool 200. The cartridge 220 includes the tool tip 221, a heater 222, a temperature sensor 223, and the non-volatile memory 224.

The heater 222 heats the tool tip 221. Examples of heating the tool tip 221 by the heater 222 may include a way (resistive heating way) of heating the tool tip 221 by a heating element (e.g., a nichrome wire, ceramics, or other element) and a way (high frequency induction heating way) of causing the tool tip 221 to generate heat.

The temperature sensor 223 is arranged near the tool tip 221 for measuring a temperature of the tool tip 221 and outputting a signal indicating the measured temperature of the tool tip 221. The temperature sensor 223 is, for example, a thermocouple.

The non-volatile memory 224 can repetitively write information and store cartridge information CI about the cartridge 220. The cartridge information CI contains identification information of the cartridge 220, information representing the shape of the tool tip 221, information representing the number of times of use of the tool tip 221, information representing an electric application time of the heater 222, information representing a calibration result about the cartridge 220, and other information. The non-volatile memory 224 is composed of, for example, an EEPROM (Electrically Erasable Programmable Read-Only Memory).

The handle 210 includes a microcomputer 211 and an acceleration sensor 212. For instance, the microcomputer 211 has operability of reading out, from the non-volatile memory 224, the cartridge information CI stored in the non-volatile memory 224 and transmitting the read information to the soldering tool control device 100 in response to an instruction from the soldering tool control device 100. The microcomputer 211 has operability of writing the cartridge information CI in the non-volatile memory 224 in response to another instruction from the soldering tool control device 100.

The acceleration sensor 212 measures an acceleration rate generated in the soldering tool 200. The acceleration sensor 212 is used, for example, to detect lowering of the soldering tool 200. The acceleration sensor 212 may adopt, for example, an electrostatic capacitance detection way or a piezoresistive way.

The handle 210 and the soldering tool control device 100 are connected to each other by the cable CB. The cable CB includes a power line for supplying electric power to the heater 222, a signal line for sending an output signal of the temperature sensor 223, and a communication line used for a communication with the microcomputer 211. Use of a power line communication eliminates the need of the signal line and the communication line.

Figure 3:
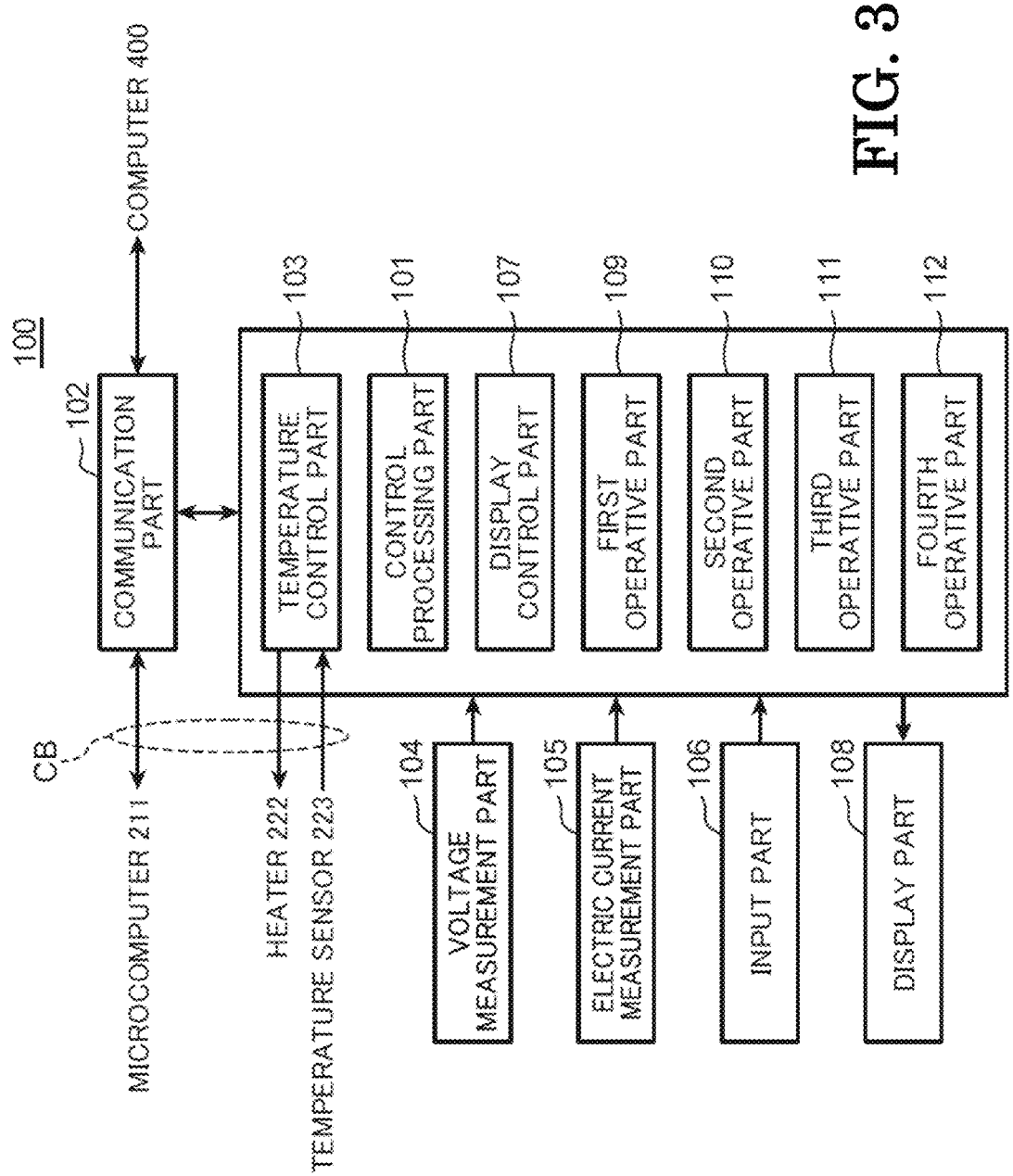
FIG. 3 is a block diagram showing an operative configuration of a soldering tool control device.

FIG. 3 is a block diagram showing an operative configuration of the soldering tool control device 100. As shown in FIG. 3, the soldering tool control device 100 includes a control processing part 101, a communication part 102, a temperature control part 103, a voltage measurement part 104, an electric current measurement part 105, an input part 106, a display control part 107, a display part 108, a first operative part 109, a second operative part 110, a third operative part 111, and a fourth operative part 112.

The control processing part 101 is established by, for example, a microcomputer including: a CPU (Central Processing Unit); a memory, such as a RAM (Random Access Memory) and a ROM (Read Only Memory); and a storage device, such as an HDD (Hard Disk Drive), and by a program and data for executing the operability of the control processing part 101.

Each of the temperature control part 103, the display control part 107, the first operative part 109, the second operative part 110, the third operative part 111, and the fourth operative part 112 is also established by a microcomputer and by a program and data for executing the operability of each part, in the same manner as the control processing part 101.

The communication part 102 is communicative with the microcomputer 211 (FIG. 2) included in the handle 210. Specifically, the communication part 102 includes, for example, a UART (Universal Asynchronous Receiver Transmitter) for a serial communication with the microcomputer 211.

The communication part 102 is communicative with the computer 400. Specifically, the communication part 102 includes a communication interface circuit for performing a wired communication based on, for example, the Ethernet (registered trademark) standard with the computer 400.

The communication between the microcomputer 211 and the computer 400 via the communication part 102 is not limited to the serial communication and the wired communication, but may be an infrared communication based on, for example, an IrDA (Infrared Data Association) standard or a wireless communication based on, for example, the Bluetooth (registered trademark) standard.

The voltage measurement part 104 is a circuit for measuring a voltage applied to the heater 222. The electric current measurement part 105 is a circuit for measuring an electric current supplied to the heater 222. The voltage measurement part 104 and the electric current measurement part 105 are respectively connected to the power line included in the cable CB for supplying the electric power to the heater 222. The electric current measurement part 105 is connected in series between a ground terminal of the heater 222 and the ground. The voltage measurement part 104 is connected in series between a power source terminal of the heater 222 and the ground.

The temperature control part 103 performs a temperature control of controlling the temperature of the tool tip 221. Specifically, the temperature control part 103 controls the temperature of the heater 222 under feedback control, thereby adjusting the temperature of the tool tip 221 to a set temperature having been set in advance depending on the tool tip 221.

Specifically, upon starting the temperature control for the tool tip 221, the temperature control part 103 continuously and chronologically acquires the temperature of the tool tip 221 measured by the temperature sensor 223 (FIG. 2) of the cartridge 220, the voltage measured by the voltage measurement part 104, and the electric current measured by the electric current measurement part 105 in a predetermined measurement period (e.g., 1 second). At each time of the acquisition, the temperature control part 103 calculates a power amount for adjusting the temperature of the tool tip 221 measured by the temperature sensor 223 to the set temperature, based on the acquired temperature of the tool tip 221, voltage, and electric current, and supplies the calculated power amount to the heater 222.

The temperature control part 103 uses the communication part 102 to transmit, at each time of the acquisition of the temperature of the tool tip 221 from the temperature sensor 223, tool tip temperature information representing the acquired temperature of the tool tip 221 and an acquisition date and time of the temperature of the tool tip 221 to the computer 400. In this manner, the temperature control part 103 transmits the tool tip temperature information being chronologically continuous to the computer 400. The information representing the acquisition date and time of the temperature of the tool tip 221 is expressed with a time unit equal to or shorter than the measurement period. For example, when the measurement period indicates 1 second, the information representing the acquisition date and time of the temperature of the tool tip 221 is expressed by a year-month-date-hour-minute-second format. When the measurement period indicates 0.5 seconds, the information representing the acquisition date and time of the temperature of the tool tip 221 is expressed by a year-month-date-hour-minute-second-millisecond format.

The input part 106 is a device for receiving various inputs to the soldering tool control device 100 by the worker. Specific examples of the various inputs will be described. The worker manipulates the input part 106 to input the set temperature of the tool tip 221 to the soldering tool control device 100. The worker manipulates the input part 106 to input an instruction of reading out or writing the cartridge information CI stored in the non-volatile memory 224 included in the cartridge 220. The input part 106 is established by at least one of a hard key (e.g., a button, a switch) and a soft key (a touch panel).

The display control part 107 causes the display part 108 to display various kinds of data and information thereon. For example, the display control part 107 causes the display part 108 to display the set temperature, the cartridge information CI, and the like thereon. The display part 108 includes, for example, a liquid crystal display, an organic EL display (Organic Light Emitting Diode Display), or other display.

The first operative part 109 calculates a heat load applied to a workpiece and the solder, and the number of cumulative load applications in a predetermined calculation period (e.g., 1 second). The workpiece represents at least one of an electronic component and a land of the board W each to be soldered. The land includes a portion to which the electronic component is soldered. The number of cumulative load applications indicates a value obtained by accumulating the number of times when the cartridge 220 shifts from a load state to a load release state after an initial use of the cartridge.

The load state means a state where the temperature of the tool tip 221 decreases from the set temperature by a predetermined temperature or higher due to a contact of the tool tip 221 with the workpiece. The load release state means, for example, a return from the load state to an idling state. The idling state means a state where the tool tip 221 is not in contact with the workpiece and the temperature of the tool tip 221 is kept in a predetermined range including the set temperature. For example, the tool tip 221 may be determined to leave the workpiece at a time when the decrease in the temperature of the tool tip 221 stops and the temperature of the tool tip 221 starts to rise from a slightly changing state of the temperature toward the set temperature. The time may be regarded as indicating the load release state.

Specifically, the temperature control part 103 executes a control of returning the load state to the idling state by supplying a larger power amount to the heater 222 in the load state than the power amount in the idling state. Here, the first operative part 109 calculates, in the calculation period (e.g., 1 second), a third power amount as a heat load (thermal energy) applied to the workpiece and the solder by subtracting a predetermined first power amount supplied to the heater 222 in the idling state of the tool tip 221 from a second power amount supplied to the heater 222 in the load state of the tool tip 221. The first power amount is predetermined for each set temperature of the tool tip 221, based on a test value or other parameter.

The first operative part 109 uses the communication part 102 to transmit, at each time of the calculation of the heat load applied to the workpiece and the solder, heat load information representing the calculated heat load and a calculation date and time of the calculated heat load to the computer 400. In this manner, the first operative part 109 transmits the heat load information being chronologically continuous to the computer 400. The information representing the calculation date and time of the heat load is expressed with a time unit equal to or shorter than the calculation period. For example, when the calculation period indicates 1 second, the information representing the calculation date and time of the heat load is expressed by the year-month-date-hour-minute-second format. When the calculation period indicates 0.5 seconds, the information representing the calculation date and time of the heat load is expressed by the year-month-date-hour-minute-second-millisecond format.

The second operative part 110 calculates a cumulative electricity application time representing a cumulative value of the times in which the electric power is supplied to the heater 222 of the cartridge 220 after an initial use of the cartridge 220.

When the communication part 102 receives, from the computer 400, an instruction of reading out or writing the cartridge information CI stored in the non-volatile memory 224 included in the cartridge 220, the third operative part 111 uses the communication part 102 to request the microcomputer 211 to read out or write the cartridge information CI stored in the non-volatile memory 224 of the cartridge 220 attached to the handle 210. When the communication part 102 receives the cartridge information CI read out from the non-volatile memory 224 by the microcomputer 211 in response to the request, the third operative part 111 uses the communication part 102 to transmit the received cartridge information CI to the computer 400.

The fourth operative part 112 executes an automatic calibration process of the cartridge 220, and writes information representing a calibration result about the cartridge 220 into the cartridge information CI stored in the non-volatile memory 224 included in the cartridge 220.

Specifically, the fourth operative part 112 executes the automatic calibration process of the cartridge 220 when an instruction of executing the automatic calibration process of the cartridge 220 is input via the input part 106. The fourth operative part 112 calibrates the temperature of the tool tip 221, a leak voltage, and a resistance between the tool tip 221 and the ground in the automatic calibration process of the cartridge 220.

After finishing the automatic calibration process of the cartridge 220, the fourth operative part 112 generates, as the information representing the calibration result about the cartridge 220, information in which information representing a finish date and time of the automatic calibration process by the year-month-date-hour-minute-second format, information representing a success or a failure of the automatic calibration process, and temperature data of the tool tip 221 measured by the temperature sensor 223 and acquired by the temperature control part 103 in the automatic calibration process are associated with one another.

The fourth operative part 112 uses the communication part 102 to request the microcomputer 211 to write the generated information into the cartridge information CI stored in the non-volatile memory 224 of the cartridge 220 attached to the handle 210.

Figure 4:
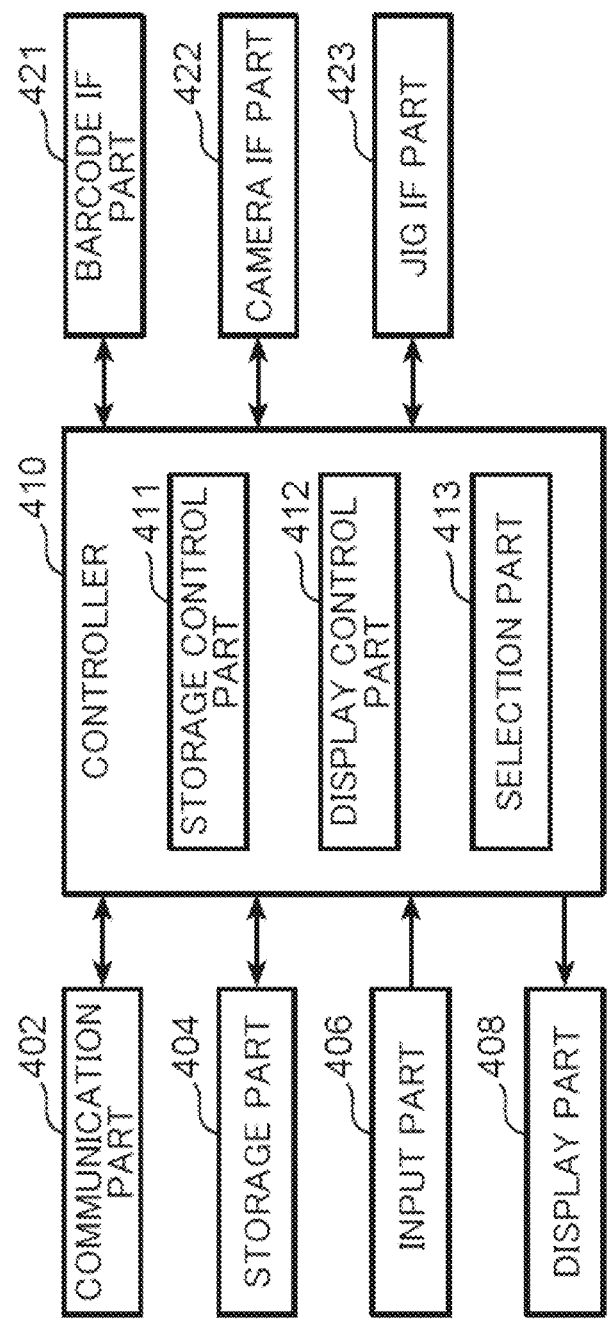
FIG. 4 is a block diagram showing an operative configuration of a computer in the first embodiment.

FIG. 4 is a block diagram showing an operative configuration of the computer 400 according to the first embodiment. As shown in FIG. 4, the computer 400 includes: a communication part 402 (a third interface); a barcode IF part 421 (a first interface, a fourth interface); a camera IF part 422 (a second interface); a jig IF part 423; a storage part 404; an input part 406; a display part 408; and a controller 410.

The communication part 402 is communicative with the soldering tool control device 100. Specifically, the communication part 402 includes a communication interface circuit for performing a data communication based on a wired communication standard, such as the Ethernet (registered trademark) standard, with the soldering tool control device 100. The communication between the soldering tool control device 100 and the communication part 402 is not limited to the wired communication, but may be, for example, an infrared communication based on, for example, the IrDA standard, or a wireless communication based on, for example, the Bluetooth (registered trademark).

For instance, the communication part 402 acquires monitor information being chronologically continuous about a soldering work from the soldering tool control device 100.

The monitor information contains heat load information transmitted from the first operative part 109 and tool tip temperature information transmitted from the temperature control part 103.

The barcode IF part 421 is connected to the barcode reader 910 by a communication cable and is configured and adaptable to perform a wired communication with the barcode reader 910. Upon receipt of the board information read by the barcode reader 910, the barcode IF part 421 outputs the received board information to the controller 410. The barcode IF part 421 may be configured and adaptable to perform an infrared communication based on, for example, the IrDA standard or a wireless communication based on, for example, the Bluetooth (registered trademark) standard with the barcode reader 910.

The camera IF part 422 is connected to the camera 920 by a communication cable and is configured and adaptable to perform a wired communication with the camera 920. Upon receipt of the captured images being chronologically continuous from the camera 920 in the soldering works manually performed by the worker on the board W, the camera IF part 422 outputs each of the received captured images being chronologically continuous to the controller 410. The camera IF part 422 may be configured and adaptable to perform a wireless communication based on, for example, the Bluetooth (registered trademark) with the camera 920.

The jig IF part 423 is connected to the switch-attached jig 930 by a communication cable, and is configured and adaptable to perform a wired communication with the switch-attached jig 930. Upon receipt of a signal, from the proximity sensor included in the switch-attached jig 930, indicating detection of a presence of the board W within the predetermined distance from the mount surface, the jig IF part 423 outputs the received signal to the controller 410.

The storage part 404 is composed of a storage device, such as an HDD and an SSD (Solid State Drive). The storage part 404 stores information about the soldering works to be manually performed on the board W under control by a storage control part 411 to be described later.

The input part 406 is a device for receiving various inputs to the computer 400 and the soldering tool control device 100 by the worker. The input part 406 is composed of an input device, such as a keyboard, a mouse, and a touch panel device.

For instance, the worker manipulates the input part 406 to input the set temperature of the tool tip 221 to the computer 400. When the input of the set temperature of the tool tip 221 is made from the input part 406, the controller 410 uses the communication part 402 to transmit information representing the set temperature to the soldering tool control device 100. Thus, the set temperature of the tool tip 221 input to the input part 406 is input to the soldering tool control device 100. The set temperature of the tool tip 221 may be directly input to the soldering tool control device 100 through a manipulation to the input part 106 of the soldering tool control device 100 by the worker.

The worker manipulates the input part 406 to input, to the computer 400, an instruction of reading out or writing the cartridge information CI stored in the non-volatile memory 224 included in the cartridge 220. When this instruction input is made from the input part 406, the controller 410 uses the communication part 402 to transmit the instruction to the soldering tool control device 100. Thus, the instruction input to the input part 406 is input to the soldering tool control device 100.

The display part 408 includes, for example, a liquid crystal display and an organic EL display. The display part 408 displays information about the soldering works to be manually performed on the board W under control by a display control part 412 to be described later.

The controller 410 is established by, for example, a microcomputer including: a CPU (Central Processing Unit); a memory, such as a RAM (Random Access Memory) and a ROM (Read Only Memory); and a storage device, such as an HDD (Hard Disk Drive), and by a program and data for executing the operability of the controller 410.

The controller 410 serves as the storage control part 411, the display control part 412, and a selection part 413 by causing the CPU to execute a program stored in the memory.

The storage control part 411 causes the storage part 404 to store various kinds of data and information therein. For instance, the storage control part 411 causes the storage part 404 to store, in association with the identification information of the board W contained in the board information acquired via the barcode IF part 421, captured image information containing: captured images continuously and chronologically acquired via the camera IF part 422; and information representing a capturing date and time of each of the captured images.

Specifically, when each of the captured images being chronologically continuous is a video image, the storage control part 411 defines the information representing an image-capturing start date and time of the video image as information representing the capturing date and time of the captured image, and causes the storage part 404 to store the captured image information: containing the defined information; and the video image in association with the identification information of the board W. In contrast, when each of the captured images being chronologically continuous is one of still images (frame images) being chronologically continuous in the image-capturing period, the storage control part 411 causes the storage part 404 to store the captured image information containing: the still image; and information representing a capturing date and time of the still image in association with the identification information of the board W in a capturing date and time order.

The information representing the capturing date and time is expressed with a time unit equal to or shorter than the image-capturing period. For example, when the image-capturing period indicates 1 second, the information representing the capturing date and time is expressed by the year-month-day-hour-minute-second format. When the image-capturing period indicates 0.1 seconds, the information representing the capturing date and time is expressed by the year-month-date-hour-minute-second-millisecond format.

The storage control part 411 causes the storage part 404 to store, in association with the identification information of the board W contained in the board information acquired via the barcode IF part 421, the monitor information continuously and chronologically acquired from the soldering tool control device 100 via the communication part 402.

The storage control part 411 causes the storage part 404 to store, in association with the identification information of the board W contained in the board information acquired via the barcode IF part 421, the identification information of the worker acquired via the barcode IF part 421.

The display control part 412 causes the display part 408 to display the various kinds of information. For instance, the display control part 412 causes the display part 408 to display a manipulation screen image for manually performing the soldering works on the board W. The manipulation screen image includes display sections for the various kinds of information, such as the identification information of the board W stored in the storage part 404.

When the worker manipulates the input part 406 to select one piece of identification information from among the identification of the board W displayed on the manipulation screen image, the selection part 413 receives the selected one piece of identification information.

When the selection part 413 receives the one piece of identification information, the display control part 412 causes the display part 408 to chronologically display each of the captured images contained in the captured image information and the monitor information stored in the storage part 404 in association with the one piece of identification information in a state where a capturing date and time of the captured image and an acquisition date and time of the monitor information match. The way of chronologically displaying the captured image and the monitor information by the display control part 412 will be described in detail later. The display control part 412 further causes the display part 408 to display the identification information of the worker stored in the storage part 404 in association with the one piece of identification information.

(Work Management Operation)

Figure 5:
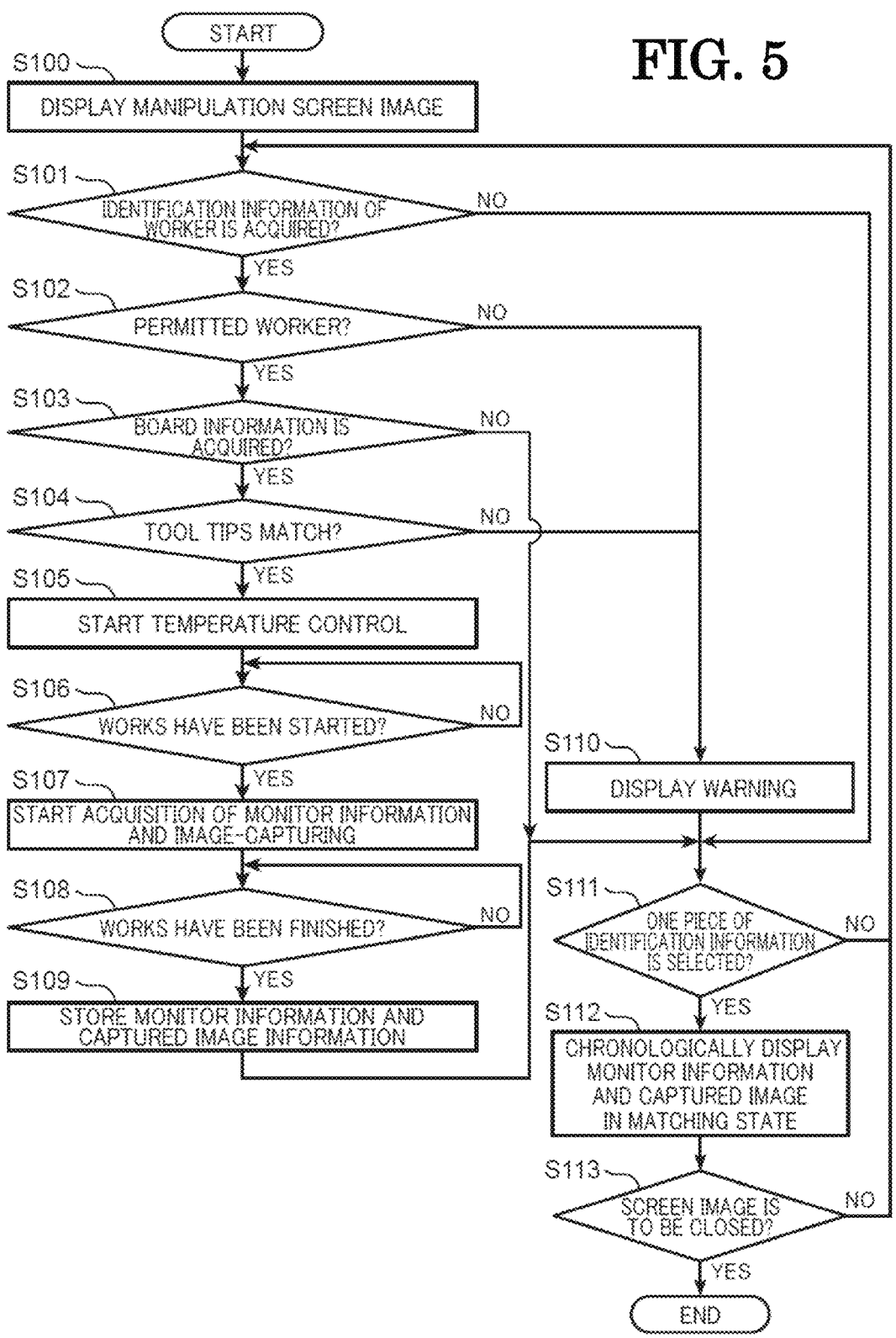
FIG. 5 is a flowchart showing a work management operation for a plurality of soldering works to be manually performed on a board in the work management system in the first embodiment.

Next, a work management operation for a plurality of soldering works to be manually performed on the board W in the work management system 1 will be described. FIG. 5 is a flowchart showing the work management operation for the plurality of soldering works to be manually performed on the board W in the work management system 1 in the first embodiment.

As shown in FIG. 5, when a worker uses the input part 406 to display a manipulation screen image for manually performing the soldering works on the board W, the display control part 412 causes the display part 408 to display the manipulation screen image (step S100).

After step S100, the worker uses the barcode reader 910 to read a barcode SB attached or printed onto an ID card SC carried by the worker, and then the controller 410 acquires identification information of the worker represented by the barcode SB via the barcode IF part 421 (YES in step S101).

In this case, the controller 410 determines whether the worker identified with the identification information acquired in step S101 is a worker (hereinafter, referred to as a "permitted worker") permitted to perform each of the soldering works (step S102).

Specifically, the controller 410 determines, in step S102, whether the identification information of the permitted worker stored in the storage part 404 in advance contains the identification information acquired in step S101. When the identification information acquired in step S101 is contained, the controller 410 determines the worker (hereinafter, referred to as a "current worker") identified with the identification information acquired in step S101 as the permitted worker.

When the current worker is not determined as the permitted worker in step S102 (NO in step S102), the display control part 412 causes the display part 408 to display a warning message stating that the current worker is not permitted to perform the soldering work (step S110). After step S110, the flow proceeds to step S111.

When the current worker is determined as the permitted worker in step S102 (YES in step S102), the current worker uses the barcode reader 910 to read a barcode WB attached or printed onto the board W, and the controller 410 acquires board information represented by the barcode WB via the barcode IF part 421 (YES in step S103).

In this case, the controller 410 determines whether the tool tip 221 of the cartridge 220 attached to the handle 210 of the soldering tool 200 and a tool tip suitable for the soldering work on the board W match (step S104).

Specifically, in step S104, the controller 410 uses the communication part 402 to transmit, to the soldering tool control device 100, an instruction of reading out cartridge information CI (FIG. 2) stored in the non-volatile memory 224. In response to the instruction, the third operative part 111 (FIG. 3) of the soldering tool control device 100 uses the communication part 102 to transmit, to the computer 400, the cartridge information CI read out from the non-volatile memory 224 of the cartridge 220 attached to the handle 210.

The controller 410 acquires the transmitted cartridge information CI via the communication part 402, and acquires soldering information contained in the board information acquired in step S103. The controller 410 determines whether information contained in the acquired cartridge information CI and representing the shape of the tool tip 221 of the cartridge 220 match information contained in the soldering information and representing a shape of the tool tip suitable for the soldering work on the board W.

When determining that the tool tip 221 of the cartridge 220 and the tool tip suitable for the soldering work on the board W match in step S104 (YES in step S104), the controller 410 causes the soldering tool control device 100 to start a temperature control for the tool tip 221 (step S105).

Specifically, in step S105, the controller 410 uses the communication part 402 to transmit, to the soldering tool control device 100, a signal indicating an instruction of starting the temperature control for the tool tip 221. When the communication part 102 of the soldering tool control device 100 receives the signal, the temperature control part 103 starts the temperature control for the tool tip 221.

Conversely, when the tool tip 221 of the cartridge 220 is determined, in step S104, not to match the tool tip suitable for the soldering work on the board W (NO in step S104), the display control part 412 causes the display part 408 to display a warning message indicating that the current tool tip 221 of the cartridge 220 is unsuitable for the soldering work on the board W (step S110). After step S110, the flow proceeds to step S111.

In step S110, the controller 410 may cause the soldering tool control device 100 to finish the temperature control for the tool tip 221. Specifically, the controller 410 may use the communication part 402 to transmit, to the soldering tool control device 100, a signal indicating an instruction of finishing the temperature control for the tool tip 221. Accordingly, when the communication part 102 of the soldering tool control device 100 receives the signal, the temperature control part 103 may finish the temperature control for the tool tip 221. This can avoid an unnecessary temperature control for the tool tip 221 unsuitable for the soldering work on the board W, resulting in saving of electric power required for the temperature control.

After step S105, the controller 410 determines whether the soldering works to be manually performed on the board W have been started (step S106).

Specifically, when acquiring, via the jig IF part 423, a signal output from the proximity sensor included in the switch-attached jig 930 and indicating detection of a presence of the board W within the predetermined distance from the mount surface, the controller 410 determines, in step S106, that the board W has been mounted on the mount surface of the switch-attached jig 930 and that the soldering works have been started.

The determination way is not limited to the foregoing, and the controller 410 may determine that the soldering works have been started in response to an input of an instruction of starting the soldering works through a manipulation to the input part 406 by the worker. Alternatively, in response to an input of an instruction of starting the temperature control for the tool tip 221 through a manipulation to the input part 106 by the worker, the temperature control part 103 may use the communication part 102 to transmit, to the computer 400, a signal indicating the instruction of starting the soldering works. When the communication part 402 receives the signal, the controller 410 may determine that the soldering works have been started.

When determining that the soldering works have been started in step S106 (YES in step S106), the controller 410 starts acquisition of monitor information and image-capturing for an entirety of the board W (step S107).

Specifically, in step S107, the controller 410 uses the communication part 402 to transmit, to the soldering tool control device 100, a signal indicating a transmission request for the monitor information. When the communication part 102 of the soldering tool control device 100 receives the signal, the first operative part 109 starts periodical calculation of a heat load applied to a workpiece and solder. At each time of the calculation of the heat load, the first operative part 109 uses the communication part 102 to transmit, to the computer 400, heat load information representing the calculated heat load and a calculation date and time (acquisition date and time) of the heat load as the monitor information. In this manner, the controller 410 acquires, via the communication part 402, the heat load information being chronologically continuous as the monitor information being chronologically continuous.

When the communication part 102 receives the signal indicating the transmission request for the monitor information, the temperature control part 103 uses the communication part 102 to transmit, to the computer 400, tool tip temperature information, as the monitor information, representing the temperature of the tool tip 221 periodically measured by the temperature sensor 223 and an acquisition date and time of the temperature of tool tip 221. Accordingly, the controller 410 acquires, as the monitor information being chronologically continuous, the tool tip temperature information being chronologically continuous via the communication part 402.

In step S107, the controller 410 causes the camera 920 connected to the camera IF part 422 to start the image-capturing for the entirety of the board W, and acquires, via the camera IF part 422, captured image information containing: each of the captured images of the entirety of the board W being chronologically continuous; and information representing a capturing date and time of the captured image.

After step S107, the controller 410 determines whether the soldering works to be manually performed on the board W have been finished (step S108).

Specifically, in step S108, when the control part 410 no longer acquires signal from the proximity sensor provided on the switch-attached jig 930 which indicates the detection of the presence of the board W within predetermined distance from the mounting surface via the jig IF part 423, the controller 410 determines, in step S108, that the board W has been dismounted from the mount surface of the switch-attached jig 930 and that the soldering works on the board W have been finished.

The determination way is not limited to the foregoing, and the controller 410 may determine that the soldering works on the board W have been finished in step S108 in response to an input of information representing the finish of the soldering works through a manipulation to the input part 406 by the worker. Alternatively, in response to an input of an instruction of finishing the temperature control for the tool tip 221 through a manipulation to the input part 106 by the worker, the temperature control part 103 may transmit, to the computer 400, a signal indicating the instruction of finishing the temperature control for the tool tip 221. When the communication part 402 receives the signal, the controller 410 may determine that the soldering works have been finished.

The acquisition of the monitor information and the image-capturing for the entirety of the board W by the camera 920 as started in step S107 are maintained unless the soldering works on the board W are determined to have been finished in step S108 (during a period with the determination NO in step S108).

When the soldering works on the board W are determined to have been finished in step S108 (YES in step S108), the storage control part 411 causes the storage part 404 to store the monitor information and captured image information being chronologically continuous and acquired in step S107 and later, in association with information representing a current date and time and the identification information of the board W contained in the board information acquired in step S103 (step S109).

In step S109, the storage control part 411 causes the storage part 404 to further store the identification information of the worker acquired in step S101, in association with the information representing the current date and time and the identification information of the board W contained in the board information acquired in step S103. After step S109, the flow proceeds to step S111.

In a case where the controller 410 does not acquire identification information of the worker via the barcode IF part 421 within a predetermined time period after step S100 (NO in step S101), the flow proceeds to step S111. In another case where the controller 410 does not acquire the board information via the barcode IF part 421 within a predetermined time period (NO in step S103) after the current worker is determined as the permitted worker in step S102 (YES in step S102), the flow proceeds to step S111.

In step S111, the selection part 413 determines whether one piece of identification information is selected from among the identification information of the board W stored in the storage part 404 (step S111).

Specifically, the display control part 412 displays, in step S100, the identification information of the board W stored in the storage part 404 on the manipulation screen image. In step S111, when the one piece of identification information is selected from among the identification information of the board W displayed on the manipulation screen image through a manipulation to the input part 406 by the worker, the selection part 413 determines that the one piece of information is selected and receives the selected one piece of identification information.

When it is determined that the one piece of identification information is selected in step S111 (YES in step S111), the display control part 412 acquires the captured image information and the monitor information stored in the storage part 404 in association with the one piece of identification information. The display control part 412 causes the display part 408 to chronologically display each of the captured images contained in the acquired captured image information and the acquired monitor information in a state where a capturing date and time of the captured image and an acquisition date and time of the monitor information match. The display control part 412 further causes the display part 408 to display the identification information of the worker stored in the storage part 404 in association with the one piece of identification information (step S112).

For instance, in step S112, an image-capturing period for the captured images and an acquisition period for the monitor information are defined to each indicate an integer multiple of a shortest period among image-capturing periods and acquisition periods to chronologically display each of the captured images and the monitor information in a state where a capturing date and time of the captured image and an acquisition date and time of the monitor information match. For instance, the image-capturing period for the captured images is supposed to be defined as 1/10 sec which is shorter than the acquisition period for the monitor information. In this case, the acquisition period for the monitor information, i.e., a calculation period for a heat load and a measurement period for a temperature of the tool tip 221, is supposed to be defined to each indicate 1 second that is 10 times the aforementioned period of 1/10 sec. Here, the image-capturing period for the captured images and the acquisition period for the monitor information may be the same.

Here, in step S112, when each of the captured images contained in the captured image information is one of still images (frame images) being chronologically continuous, the display control part 412 displays, as initial display information, one or more (pieces) of the captured images and monitor information whose corresponding capturing date and time or acquisition date and time indicates an oldest date and time in past among the captured images and monitor information being chronologically continuous. Subsequently, the display control part 412 calculates an elapsed time from a time point of displaying the initial display information every lapse of the shortest period among the image-capturing periods and the acquisition periods, and displays one or more (pieces) of the captured images and monitor information whose corresponding capturing date and time or acquisition date and time matches a date and time after the elapsed time from the oldest date and time in past.

In contrast, in step S112, when each of the captured images contained in the captured image information is a video image, the display control part 412 starts displaying the video image as long as an image-capturing start date and time of the video image is older than an acquisition date and time of the oldest monitor information acquired in past. Subsequently, the display control part 412 calculates an elapsed time from a time point of the start of displaying the video image every lapse of the shortest period among the image-capturing periods and the acquisition periods, and displays monitor information whose acquisition date and time matches a date and time after the elapsed time from the image-capturing start date and time.

In step S112, when the captured image contained in the captured image information is the video image, the display control part 412 displays the oldest monitor information acquired in past as the initial display information as long as the acquisition date and time of the oldest monitor information acquired in past is older than the image-capturing start date and time of the video image. Subsequently, the display control part 412 calculates an elapsed time from a time point of displaying the initial display information every lapse of the shortest period among the image-capturing periods and the acquisition periods, and displays the monitor information whose acquisition date and time matches a date and time after the elapsed time from the oldest date and time. Then, the display control part 412 starts the displaying of the video image concurrently with displaying the monitor information whose acquisition date and time matches the image-capturing start date and time of the video image.

Accordingly, in step S112, the display control part 412 causes the display part 408 to sequentially display the captured images of the entirety of the board W having been continuously and chronologically captured, and simultaneously, causes the display part 408 to sequentially display the monitor information acquired in the same period as that of the captured images being displayed.

Upon detection of a manipulation of closing the manipulation screen image to the input part 406 by the worker (YES in step S113) after step S112, the display control part 412 hides the manipulation screen image displayed on the display part 408, and the controller 410 finishes the work management operation. In contrast, when the display control part 412 detects no manipulation of closing the manipulation screen image to the input part 406 by the worker within a predetermined time period (NO in step S113) after step S112, the flow proceeds to step S101.

(Exemplary Manipulation Screen Image)

Figure 6:
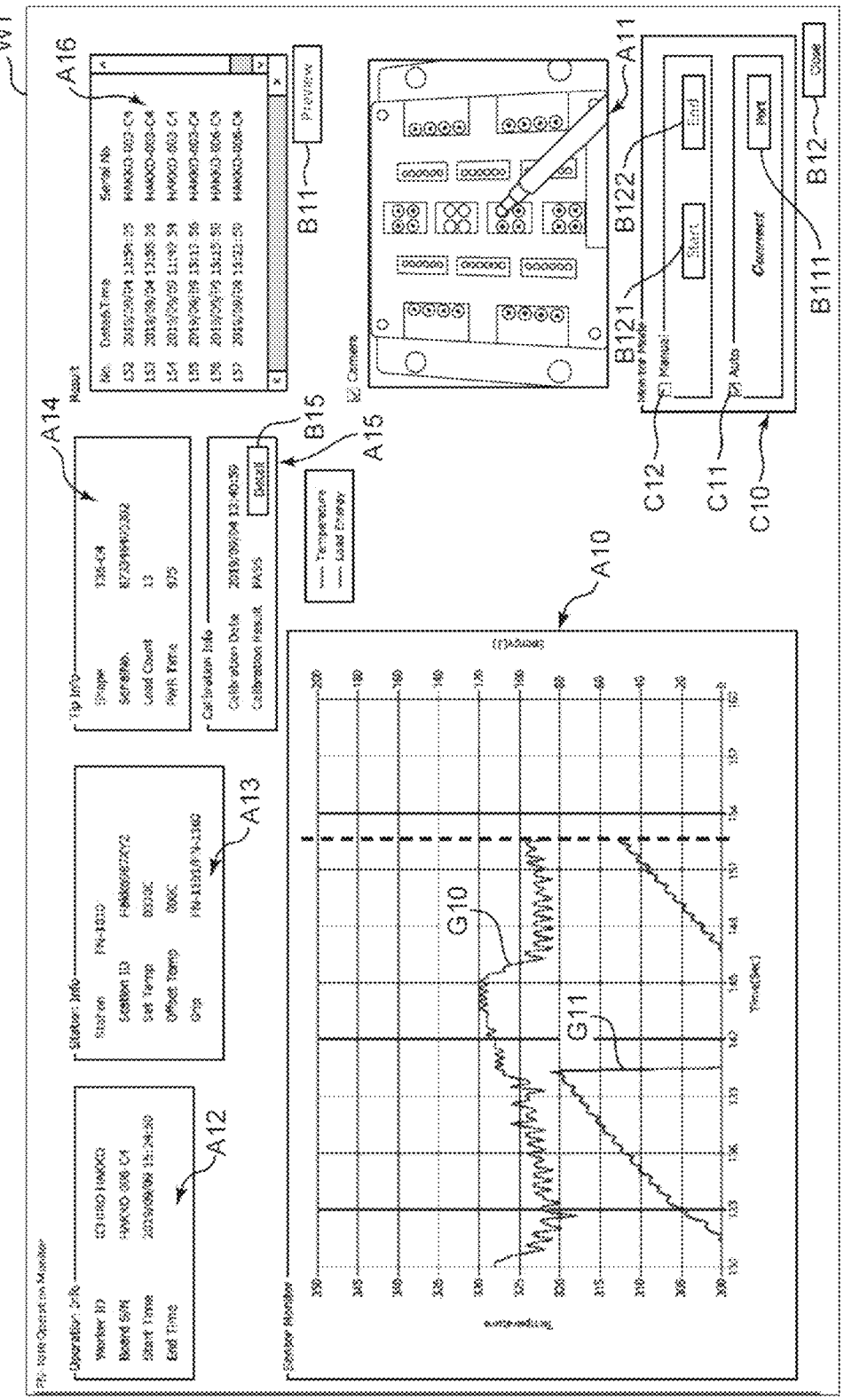
FIG. 6 shows an exemplary manipulation screen image displayed in the work management operation.

Furthermore, a manipulation screen image W1 to be displayed on the display part 408 in a work management operation will be described. FIG. 6 shows an example of the manipulation screen image W1 displayed in the work management operation. As shown in FIG. 6, the manipulation screen image W1 includes display sections A10 to A16 for various kinds of information, a mode choice section C10, a preview button B11, and a closing button B12.

The display section A10 shows monitor information being chronologically continuous. The display section A10 is in the form of a two-dimensional coordinate having a horizontal axis defining a date and time, a left vertical axis defining a temperature of the tool tip 221, and a right vertical axis defining a heat load (thermal energy) applied to a workpiece and solder.

Specifically, the display control part 412 sequentially and chronologically refers to pieces of tool tip temperature information acquired during a period from step S107 (FIG. 5) to step S108 where a plurality of soldering works to be manually performed on the board W are determined to have been finished. The display control part 412 displays, in the display section A10, dots each at a position where an acquisition date and time of a temperature of the tool tip 221 represented by the tool tip temperature information having been referred to and the temperature of the tool tip 221 meet. The display control part 412 displays a line obtained by connecting the displayed dots. Consequently, the display control part 412 displays, in the display section A10, a graph G10 showing a chronological change in the temperature of the tool tip 221.

The display control part 412 sequentially and chronologically refers to pieces of heat load information acquired during the period from step S107 (FIG. 5) to step S108 where the soldering works to be manually performed on the board W are determined to have been finished. The display control part 412 displays, in the display section A10, dots each at a position where a calculation date and time of a heat load represented by the heat load information having been referred to and the heat load meet. The display control part 412 displays a line obtained by connecting the displayed dots. Consequently, the display control part 412 displays, in the display section A10, a graph G11 showing a chronological change in the heat load.

The display section A11 shows each of the captured images of the entirety of the board W being chronologically continuous. Specifically, the display control part 412 displays, in the display section A11, each of the captured images of the entirety of the board W contained in the captured image information acquired via the camera IF part 422 during the period from step S107 (FIG. 5) to step S108 where the soldering works to be manually performed on the board W are determined to have been finished.

The display section A12 shows information about the soldering works on the board W. Specifically, the display control part 412 displays, in the row "Worker ID" in the display section A12, the identification information (e.g., ICHIRO HAKKO) of the current worker acquired in step S101. The display control part 412 displays, in the row "Board S/N" in the display section A12, the identification information (e.g., HAKKO-006-C4) of the board W contained in the board information acquired in step S103.

The display control part 412 displays, in the row "Start Time" in the display section A12, a date and time when the soldering works are determined to have been started in step S106 by, for example, the year-month-date-hour-minute-second format (e.g., 2019/09/09 15:24:50). The display control part 412 displays, in the row "End Time" in the display section A12, a date and time when the soldering works are determined to have been finished in step S108 by, for example, the year-month-date-hour-minute-second format. Here, FIG. 6 shows an example where the row "End Time" is blank to indicate that the soldering works on the board W identified as "HAKKO-006-C4" have not been finished yet.

The display section A13 shows information about setting of the soldering tool control device 100. Specifically, in step S100, the display control part 412 uses the communication part 402 to request the soldering tool control device 100 to transmit the information about the setting of the soldering tool control device 100 when causing the display part 408 to display the manipulation screen image W1. The display control part 412 displays, in the display section A13, the information about the setting of the soldering tool control device 100 transmitted from the soldering tool control device 100 in response to the request and received by the communication part 402.

FIG. 6 exemplarily shows the display section A13 including the rows "Station", "Station ID", "Set Temp", "Offset Temp", and "Grip" for respectively displaying information representing a model number of the soldering tool control device 100 (FN-1010), identification information of the soldering tool control device 100 (Hakko987XYZ), information representing the set temperature of the tool tip 221 (0330C), information representing the offset temperature of the tool tip 221 (000C), and identification information of the handle 210 (FN-1101/FN-1102), each piece of information being contained in the information about the setting of the soldering tool control device 100 acquired from the soldering tool control device 100.

The display section A14 shows the cartridge information CI. Specifically, in step S100, the display control part 412 uses the communication part 402 to transmit, to the soldering tool control device 100, an instruction of reading out the cartridge information CI stored in the non-volatile memory 224 included in the cartridge 220 when causing the display part 408 to display the manipulation screen image W1. When the communication part 402 receives the cartridge information CI from the soldering tool control device 100 in response to the instruction, the display control part 412 displays, in the display section A14, various kinds of information contained in the received cartridge information CI.

FIG. 6 exemplarily shows the display section A14 including the rows "Shape", "Serial No.", "Local Count", "Load Count", and "PWR Time" for respectively displaying information representing a shape of the tool tip 221 (T36-C4), identification information of the cartridge 220 (873346400302), information representing the number of times of use of the tool tip 221 (13), information representing an electric application time of the heater 222 (975), each piece of information being contained in the cartridge information CI acquired from the soldering tool control device 100.

The display section A15 shows a calibration result about the cartridge 220. Specifically, in step S100, the display control part 412 uses the communication part 402 to transmit, to the soldering tool control device 100, an instruction of reading out the cartridge information CI stored in the non-volatile memory 224 included in the cartridge 220 when causing the display part 408 to display the manipulation screen image W1. When the communication part 402 receives the cartridge information CI transmitted from the third operative part 111 of the soldering tool control device 100 in response to the instruction, the display control part 412 displays, in the display section A15, information representing the calibration result about the cartridge 220, the information being contained in the received cartridge information CI.

FIG. 6 exemplarily shows the display section A15 including the rows "Date" and "Result" for respectively displaying information representing a finish date and time of an automatic calibration process of the cartridge 220 (2019/09/04 13:40:59) and information representing a success or a failure in the automatic calibration process ("PASS", which means "success"), each piece of information being contained in the information representing the calibration result about the cartridge 220 acquired from the soldering tool control device 100.

The display section A15 includes a detail display button B15. When the detail display button B15 is pushed downward through a manipulation to the input part 406 by the worker, the display control part 412 causes the display part 408 to display a display screen image of temperature data of the tool tip 221 contained in the information representing the calibration result about the cartridge 220 acquired from the soldering tool control device 100.

The display section A16 selectively shows the identification information of the board W stored in the storage part 404. Specifically, when the manipulation screen image W1 is displayed to the display part 408 in step S100, and when step 109 is executed, the display control part 412 links the information stored in the storage part 404, the information representing a current date and time when the soldering works are determined to have been finished by the year-month-date-hour-minute-second format (e.g., 2019/09/04 13:54:05) and identification information of the board W (e.g., HAKKO-003-C4), and displays to the display section A16 in a selectable state.

The mode choice section C10 is provided to allow the worker to choose whether to automatically display the monitor information and each of the captured images of the entirety of the board W. The mode choice section C10 includes a first choice button C11 and a second choice button C12. The first choice button C11 allows the worker to choose to automatically display the monitor information and the captured image of the entirety of the board W. The second choice button C12 allows the worker to choose to manually display the monitor information and the captured image of the entirety of the board W and manually finish the displaying.

In a case where the first choice button C11 is chosen through a manipulation to the input part 406 by the worker, the display control part 412 chronologically displays the monitor information in the display section A10 and chronologically displays the captured images of the entirety of the board W in the display section A11 in the manner described above during the period from step S107 (FIG. 5) to step S108 where the soldering works are determined to have been finished. The display control part 412 places a port button B111 in a pushable state (so as to be effective) when the first choice button C11 is chosen. When the port button B111 is pushed downward through a manipulation to the input part 406 by the worker, the display control part 412 causes the display part 408 to display a setting screen image of a USB port for use in connecting the switch-attached jig 930 and the jig IF part 423.

In contrast, when the second choice button C12 is chosen through a manipulation to the input part 406 by the worker, the display control part 412 places a start button B121 and a end button B122 in a pushable state (so as to be effective). In this case, the display control part 412 chronologically displays, in the display sections A10, A11, the monitor information and the captured images acquired in a sub-period from the downward pushing of the start button B121 to the downward pushing of the end button B122 through the corresponding manipulations to the input part 406 by the worker for only the sub-period during the period from step S107 (FIG. 5) to step S108 where the soldering works to be manually performed on the board W are determined to have been finished.

The preview button B11 is a button for displaying the monitor information and each of the captured images corresponding to one piece of identification information selected from among the identification information of the board W displayed in the display section A16.

Specifically, when the one piece of identification information is selected from among the identification information of the board W displayed in the display section A16 through a manipulation to the input part 406 by the worker, the selection part 413 receives the one piece of identification information in step S111 (FIG. 5). Thereafter, when the preview button B11 is pushed downward through a manipulation to the input part 406 by the worker, the flow proceeds to step S112.

Consequently, the display control part 412 displays, in the display sections A10, A11, each of the captured images contained in the captured image information and the monitor information each stored in the storage part 404 in association with the one piece of identification information in a state where a capturing date and time of the captured image and an acquisition date and time contained in the monitor information match.

The closing button B12 is a button for allowing the worker to select finishing the work management operation by hiding the manipulation screen image. Specifically, when the closing button B12 is pushed downward through a manipulation to the input part 406 by the worker, the display control part 412 detects the manipulation of closing the manipulation screen image (YES in step S113). In this case, the display control part 412 hides the manipulation screen image displayed on the display part 408 and the controller 410 finishes the work management operation, as described above.

Second Embodiment

In a case where a work position is predetermined for each of soldering works to be performed on a board W, the work position of the soldering work may be notified to a worker to thereby improve efficiency of the soldering work. Hereinafter, a second embodiment for achieving this aspect will be described. In the description for the second embodiment, structural elements which are the same as the elements in the first embodiment will be given the same reference numerals as those used in the first embodiment, and thus the explanation for the elements will be appropriately omitted.

Figure 7:
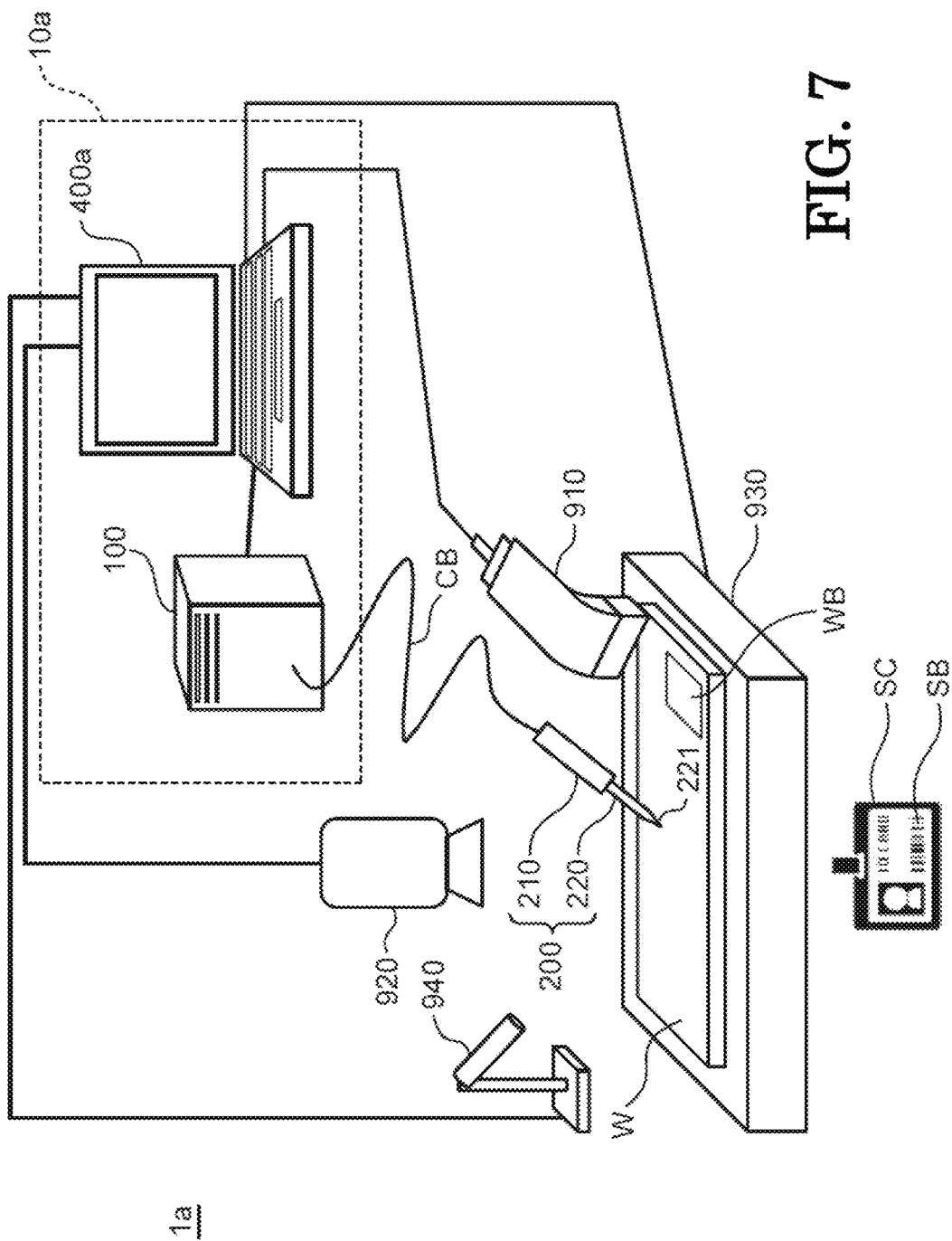
FIG. 7 shows an overall configuration of a work management system in a second embodiment.

FIG. 7 shows an overall configuration of a work management system 1a in a second embodiment. As shown in FIG. 7, the work management system 1a in the second embodiment includes a barcode reader 910, a camera 920, a switch-attached jig 930 in the same manner as the work management system 1 (FIG. 1) in the first embodiment, and further includes a marker device 940 and a work management apparatus 10a corresponding to the work management apparatus 10.

The marker device 940 is connected to the work management apparatus 10a by a communication cable, and is configured and adaptable to perform a wired communication with the work management apparatus 10a. The marker device 940 is fixed at a position at a predetermined distance from a reference position defined by a mount position on a mount surface of the switch-attached jig 930 for the board W in a predetermined direction. The marker device 940 applies a marker, such as a laser marker or a spotlight marker, indicating a position instructed by the work management apparatus 10a onto the board W. The marker device 940 may be configured and adaptable to perform a wireless communication with the work management apparatus 10a.

The work management apparatus 10a includes a soldering tool control device 100 in the same manner as the work management apparatus 10 (FIG. 1) in the first embodiment, and further includes a computer 400a corresponding to the computer 400.

Figure 8:
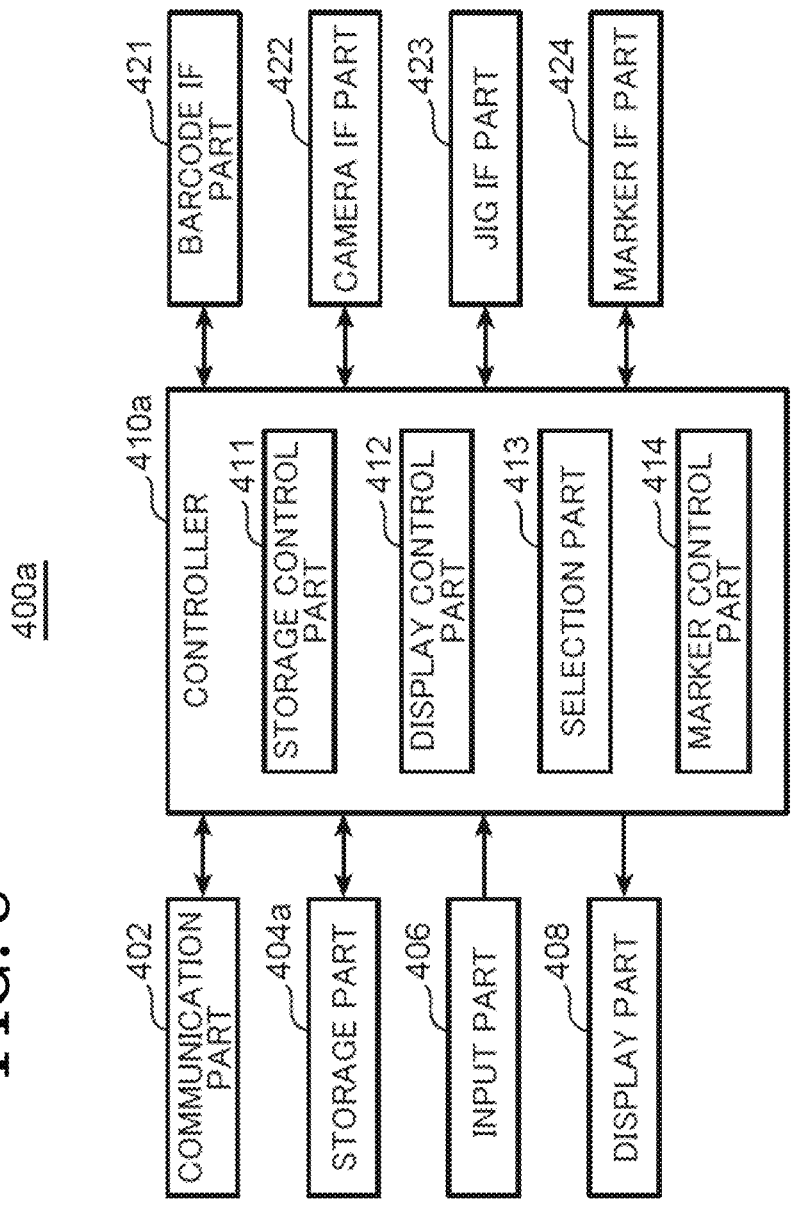
FIG. 8 is a block diagram showing an operative configuration of a computer in the second embodiment.

FIG. 8 is a block diagram showing an operative configuration of the computer 400a in the second embodiment. As shown in FIG. 8, the computer 400a includes: a communication part 402; a barcode IF part 421; a camera IF part 422; a jig IF part 423; an input part 406; and a display part 408 in the same manner as the computer 400 in the first embodiment, and further includes: a storage part 404a (a second storage) corresponding to the storage part 404; a marker IF part 424 (a fifth interface); and a controller 410a corresponding to the controller 410.

The storage part 404a stores, in association with identification information of the board W, a plurality of pieces of work position information each representing the work position of each of the soldering works on the board W in a work order in advance.

The marker IF part 424 is connected to the marker device 940 by a communication cable, and is configured and adaptable to perform a wired communication with the marker device 940. The marker IF part 424 serves as a driver for driving the marker device 940, and drives the marker device 940 to apply a marker indicating a position instructed by the controller 410a onto the board W. The marker IF part 424 may be configured to and adaptable to perform an infrared communication based on, for example, the IrDA standard or a wireless communication based on, for example, the Bluetooth (registered trademark) standard with the marker device 940.

The controller 410a is established by, for example, a microcomputer including: a CPU (Central Processing Unit); a memory, such as a RAM (Random Access Memory) and a ROM (Read Only Memory); and a storage device, such as an HDD (Hard Disk Drive), and by a program and data for executing the operability of the controller 410a, in the same manner as the controller 410 in the first embodiment.

The controller 410a serves as a storage control part 411, a display control part 412, and a selection part 413 by causing the CPU to execute a program stored in a memory in the same manner as the controller 410 in the first embodiment, and further serves as a marker control part 414 (a fifth interface).

The marker control part 414 reads out work position information representing a work position of a subsequent soldering work from among the pieces of work position information stored in the storage part 404a, and outputs the read work position information to the marker IF part 424. In this manner, the marker IF part 424 drives the marker device 940 to apply a marker indicating the work position represented by the work position information input from the marker control part 414 onto the board W.

(Work Management Operation)

Figure 9:
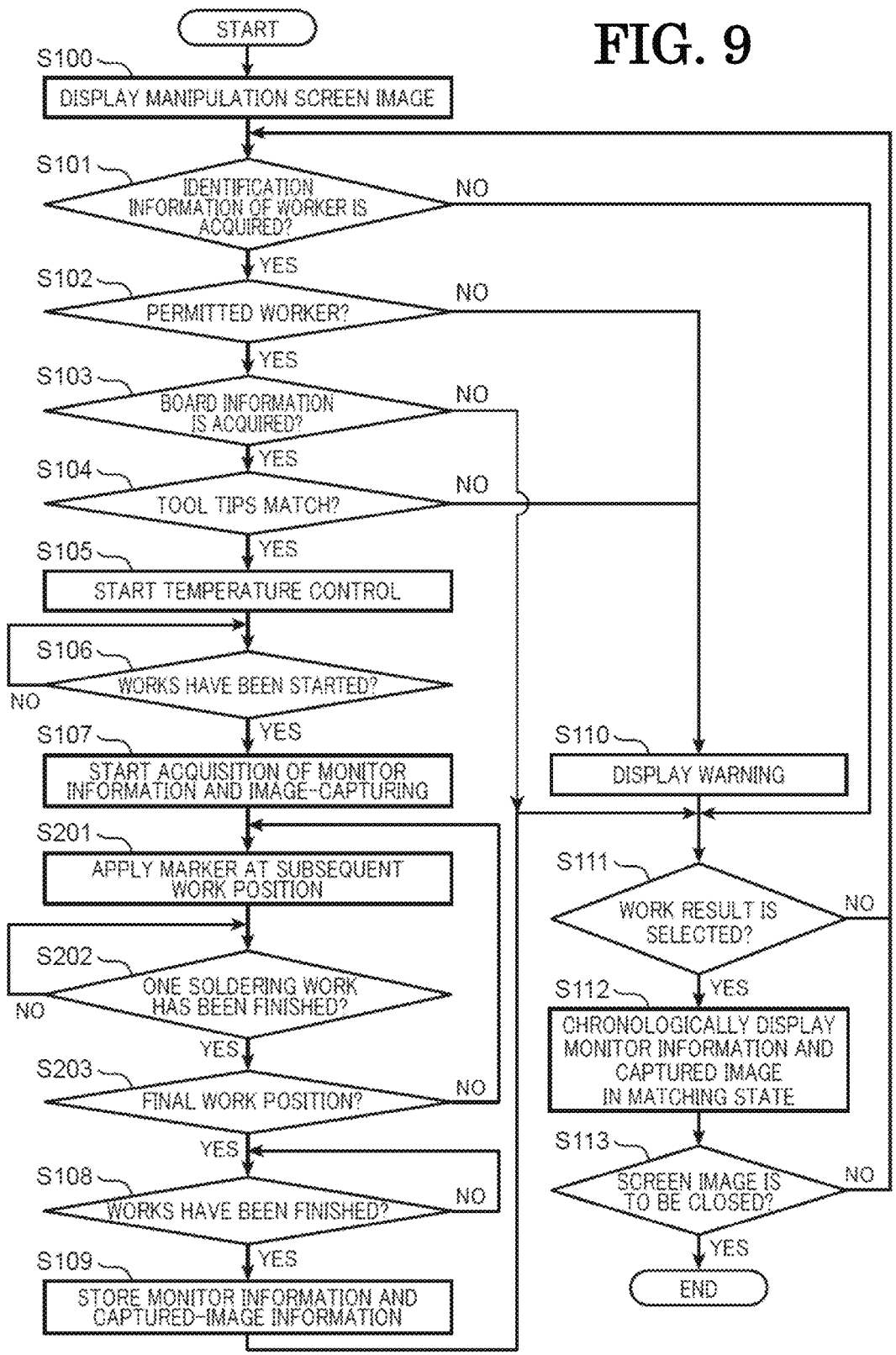
FIG. 9 is a flowchart showing a work management operation for a plurality of soldering works to be manually performed on a board in the work management system in the second embodiment.

Next, a work management operation for a plurality of soldering works to be manually performed on the board W in the work management system 1a will be described. FIG. 9 is a flowchart showing the work management operation for the soldering works to be manually performed on the board W in the work management system 1a in the second embodiment.

As shown in FIG. 9, in the work management operation in the work management system 1a in the second embodiment, the marker control part 414 causes the marker device 940 to apply a marker indicating a work position of a subsequent soldering work onto the board W (step S201) after start of acquisition of monitor information and image-capturing for an entirety of the board W in step S107.

Specifically, the marker control part 414 reads out work position information representing the work position of the subsequent soldering work from among a plurality of pieces of work position information stored in the storage part 404a, and outputs the read work position information to the marker IF part 424 in step 201. In this manner, the marker IF part 424 drives the marker device 940 to apply a marker indicating the work position represented by the work position information input from the marker control part 414 onto the board W.

After step S201, the marker control part 414 determines, based on the monitor information being chronologically continuous as acquired in S107 and later, whether one soldering work has been finished (step S202).

For instance, in step S202, the marker control part 414 determines that the one soldering work has been finished, with reference to a heat load represented by heat load information being chronologically continuous as acquired in step S107 and later, at a time when the heat load increases from 0 and thereafter returns to 0, i.e., at a time when a graph G11 (FIG. 6) showing a chronological change in the heat load finishes. Here, the way of determining the finish of the one soldering work in step S202 is not limited thereto.

The marker control part 414 repeats Step S202 until the marker control part determines that the one soldering work has been finished in step S202 (during a period with the determination NO in step S202). Then, when finally determining that the one soldering work has been finished (YES in step S202), the marker control part 414 determines whether a work position currently applied with a marker indicates a final work position (step S203).

Specifically, when the storage part 404a stores no work position information representing a work position subsequent to the work position represented by the work position information read out in step S201, the marker control part 414 determines, in step S203, that the work position currently applied with the marker is the final work position.

When the work position currently applied with the marker is determined as the final work position in step S203 (YES in step S203), the flow proceeds to step 108. Conversely, when the work position currently applied with the marker is not determined as the final work position in step S203 (NO in step S203), the flow proceeds to step 201.

Third Embodiment

It may be determined, at each time a soldering work is performed on a board W, whether the soldering work satisfies a predetermined criterion, thereby allowing a worker to more accurately perform a subsequent soldering work. Hereinafter, a third embodiment for achieving this aspect will be described. In the description for the third embodiment, structural elements which are the same as the elements in the second embodiment will be given the same reference numerals as those used in the second embodiment, and thus the explanation for the elements will be appropriately omitted.

Figure 10:
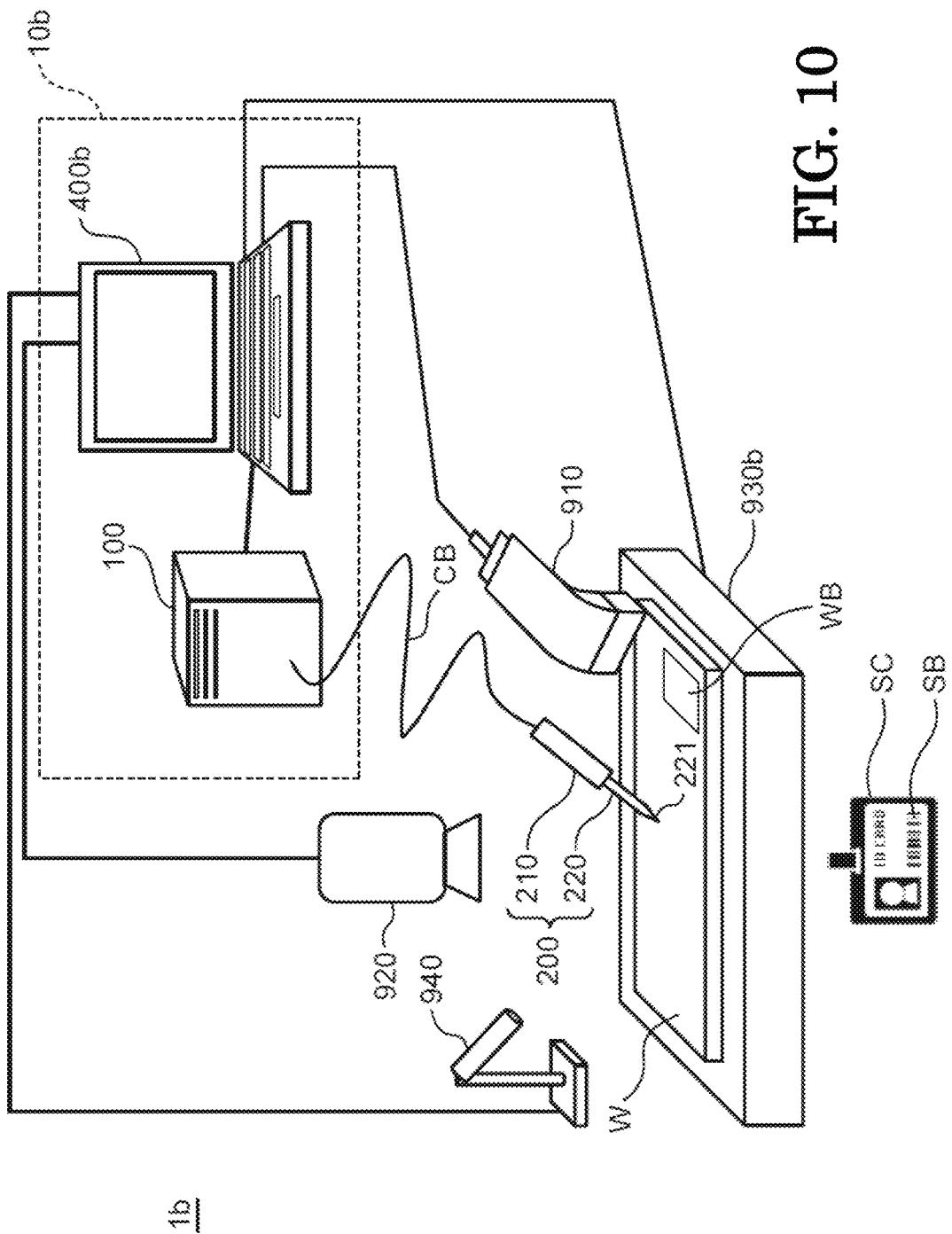
FIG. 10 shows an overall configuration of a work management system in a third embodiment.

FIG. 10 shows an overall configuration of a work management system 1b in the third embodiment. As shown in FIG. 10, the work management system 1b in the third embodiment includes a barcode reader 910, a camera 920, and a marker device 940 in the same manner as the work management system 1a (FIG. 7) in the second embodiment, and further includes a switch-attached jig 930b (soldering monitor device) corresponding to the switch-attached jig 930 and a work management apparatus 10b corresponding to the work management apparatus 10a.

The switch-attached jig 930b further includes a scaler in addition to the same configuration as the switch-attached jig 930 in the second embodiment. The scaler continuously and chronologically measures a weight load applied to a mount surface of the board W, and transmits, as monitor information, weight load information representing the measured weight load being chronologically continuous and a measurement date and time of the weight load to the work management apparatus 10b. The information representing the measurement date and time of the weight load is expressed with a time unit equal to or shorter than a measurement period. For example, when the measurement period indicates 1 second, the information representing the measurement date and time of the overload is expressed by the year-month-date-hour-minute-second format. When the measurement period indicates 0.5 seconds, the information representing the measurement date and time of the weight load is expressed by the year-month-date-hour-minute-second-millisecond format.

The work management apparatus 10b includes a soldering tool control device 100 in the same manner as the work management apparatus 10a (FIG. 7) in the second embodiment, and further includes a computer 400b corresponding to the computer 400a.

Figure 11:
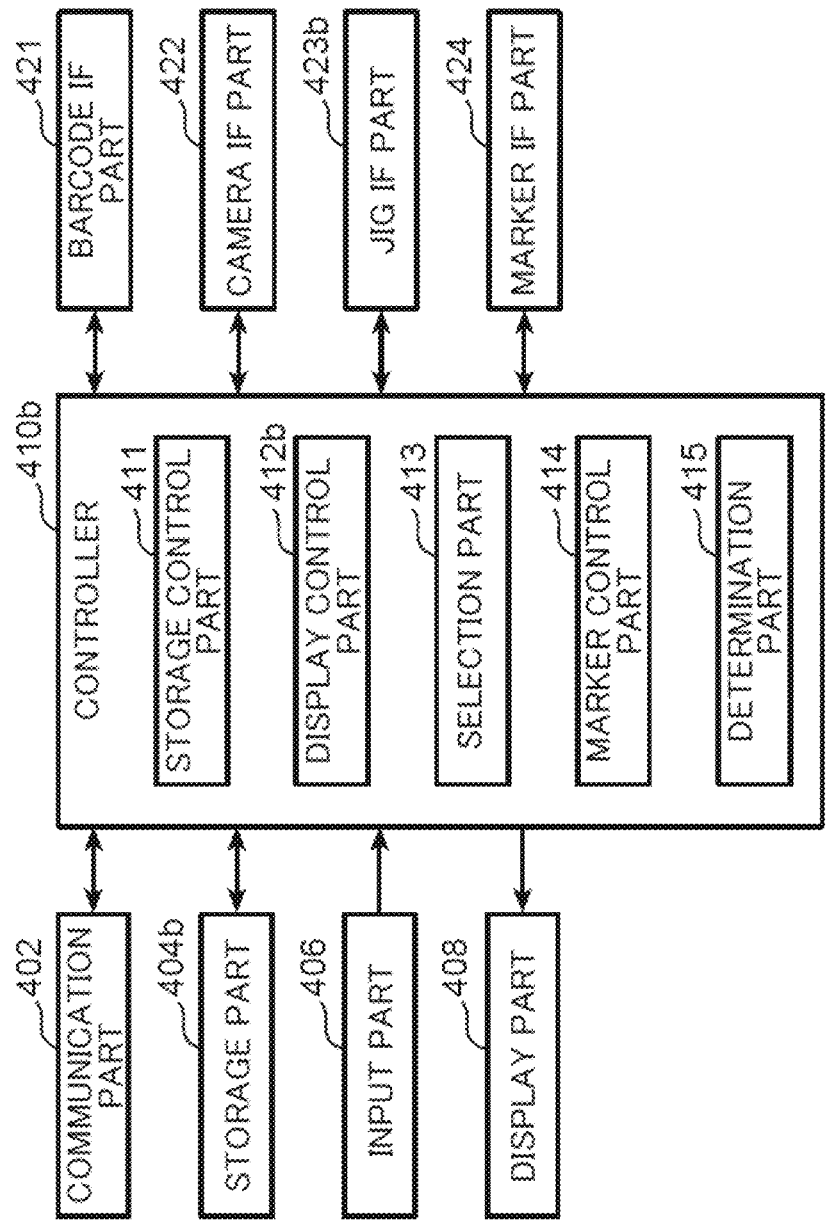
FIG. 11 is a block diagram showing an operative configuration of a computer in the third embodiment.

FIG. 11 is a block diagram showing an operative configuration of the computer 400b in the third embodiment. As shown in FIG. 11, the computer 400b includes: a communication part 402; a barcode IF part 421; a camera IF part 422; a marker IF part 424; an input part 406; and a display part 408 in the same manner as the computer 400a (FIG. 8)

in the second embodiment, and further includes: a storage part 404*b* corresponding to the storage part 404*a*; a jig IF part 423*b* corresponding to the jig IF part 423; and a controller 410*b* corresponding to the controller 410*a*.

The storage part 404*b* stores, in association with identification information of the board W, criterion information about a criterion for a soldering work on the board W in addition to the information stored in the storage part 404*a* in advance in the second embodiment.

For example, the criterion information includes information presenting an upper limit solder amount, a lower limit solder amount, an upper limit energy amount, a lower limit energy amount, an upper limit load time, an upper limit weight load time, an upper limit pressure, a lower limit pressure, a maximum fall temperature, and a soldering point number.

The upper limit solder amount and the lower limit solder amount respectively indicate an upper limit and a lower limit of an amount of solder deposited on the board W in one soldering work. The upper limit energy amount and the lower limit energy amount respectively indicates an upper limit and a lower limit of an amount of a heat load applied to a workpiece and solder in the one soldering work on the board W. The upper limit load time indicates an upper limit of a time during which the heat load is applied to the workpiece and the solder in the one soldering work on the board W. The upper limit weight load time indicates an upper limit of a time during which a weight load is applied to the workpiece in the one soldering work on the board W. The upper limit pressure and the lower limit pressure respectively indicate an upper limit and a lower limit of the weight load applied to the workpiece in the one soldering work on the board W. The upper limit fall temperature indicates an upper limit of a fall temperature indicating a lowest temperature of a tool tip 221 in the one soldering work on the board W. The soldering point number indicates the number of positions on the board W for performing soldering works.

The jig IF part 423*b* has a configuration similar to the configuration of the jig IF part 423 in the second embodiment. Furthermore, upon receipt of the weight load information being chronologically continuous from the scaler included in the switch-attached jig 930*b*, the jig IF part 423*b* outputs, as monitor information being chronologically continuous, the received weight load information being chronologically continuous to the controller 410*b*.

The controller 410*b* is established by, for example, a microcomputer including: a CPU (Central Processing Unit); a memory, such as a RAM (Random Access Memory) and a ROM (Read Only Memory); and a storage device, such as an HDD (Hard Disk Drive), and by a program and data for executing the operability of the controller 410*b*, in the same manner as the controller 410*a* in the second embodiment.

The controller 410*b* serves as a storage control part 411, a selection part 413, and a marker control part 414 by causing the CPU to execute a program stored in a memory in the same manner as the controller 410*a* in the second embodiment, and further serves as a determination part 415 and a display control part 412*b* corresponding to the display control part 412.

The determination part 415 determines, at each time one soldering work among a plurality of soldering works on the board W is finished, whether monitor information in the one soldering work satisfies a predetermined criterion.

The monitor information in the one soldering work includes an energy amount, a load time, a fall temperature, a maximum weight load, a weight load time, and a solder amount.

The energy amount indicates an integrated value of the heat load represented by the heat load information being chronologically continuous as acquired in the one soldering work. The load time indicates a sum of times in which the heat load represented by the heat load information being chronologically continuous as acquired in the one soldering work reaches 0 or more and then returns to 0 next time.

The fall temperature indicates a lowest temperature among temperatures of the tool tip 221 represented by the tool tip temperature information being chronologically continuous as acquired in the one soldering work. The maximum weight load indicates a weight load with a maximum difference from an initial weight load represented by initial weight load information among weight loads applied to the mount surface of the board W and represented by the weight load information being chronologically continuous as acquired in the one soldering work.

The weight load time is a sum of times from when the difference between the loads applied to the mounting surface of the board W and the initial load indicated by the chronologically continuous weight load information acquired during one soldering work becomes 0 or greater until it next turns back to 0. The solder amount indicates a difference between the initial weight load represented by the initial weight load information among the weight load information being chronologically continuous as acquired in the one soldering work, and a final weight load represented by final weight load information.

The display control part 412*b* is operative in the same manner as the display control part 412 in the second embodiment, and further changes, when the determination part 415 determines that the monitor information in the one soldering work satisfies the predetermined criterion, a display mode for the monitor information.

(Work Management Operation)

Figure 12:
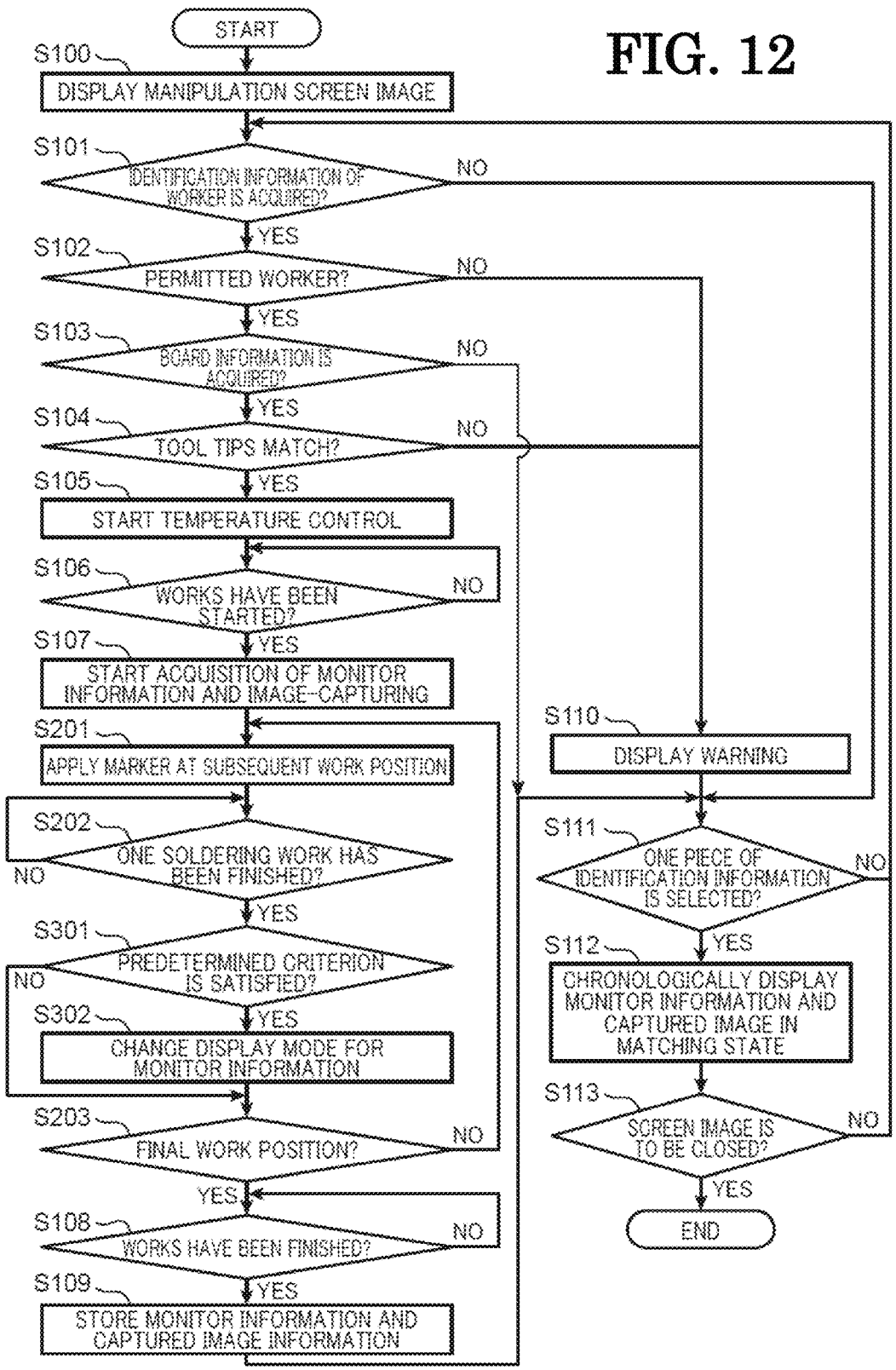
FIG. 12 is a flowchart showing a work management operation for a plurality of soldering works to be manually performed on a board in the work management system in the third embodiment.

Next, a work management operation for a plurality of soldering works to be manually performed on the board W in the work management system 1*b* in the third embodiment will be described. FIG. 12 is a flowchart showing the work management operation for the soldering works to be manually performed on the board W in the work management system 1*b* in the third embodiment.

As shown in FIG. 12, in the work management operation in the work management system 1*b* in the third embodiment, when one soldering work is determined to have been finished in step S202 (YES in step S202), the determination part 415 determines whether monitor information in the one soldering work satisfies a predetermined criterion (step S301).

For instance, in step S301, the determination part 415 makes one or more determinations among the following determinations (1) to (8) by using criterion information stored in the storage part 404*b* in association with the identification information of the board W contained in the board information acquired in step S103.

(1) The determination part 415 determines that the predetermined criterion is satisfied when an energy amount is larger than an upper limit energy amount represented by the criterion information. (2) The determination part 415 determines that the predetermined criterion is satisfied when a load time is longer than an upper limit load time represented by the criterion information. According to the determinations (1) and (2), it is possible to determine that a heat load applied to a workpiece and solder may be too excessive, resulting in an overburden on the tool tip 221 in the one soldering work.

(3) The determination part 415 determines that the predetermined criterion is satisfied when the energy amount is smaller than a lower limit energy amount represented by the criterion information. According to the determination (3), it is possible to determine that a heat load applied to the workpiece and the solder may be too deficient, and thus the solder may be inappropriately deposited on the workpiece in the one soldering work.

(4) The determination part 415 determines that the predetermined criterion is satisfied when a fall temperature is higher than an upper limit fall temperature represented by the criterion information. According to the determination (4), it is possible to determine that an excessive heat of the tool tip 221 may be transferred to the workpiece and damage the workpiece in the one soldering work.

(5) The determination part 415 determines that the predetermined criterion is satisfied when a maximum weight load is larger than an upper limit pressure represented by the criterion information. (6) The determination part 415 determines that the predetermined criterion is satisfied when a weight load time is longer than an upper limit weight load time represented by the criterion information. According to the determinations (5) and (6), it is possible to determine that an unnecessarily applied weight load to the workpiece may damage the workpiece in the one soldering work.

(7) The determination part 415 determines that the predetermined criterion is satisfied when a maximum weight load is smaller than a lower limit pressure represented by the criterion information. According to the determination in (7), it is possible to determine that a weight load applied to the workpiece may be insufficient, and thus the solder may be inappropriately deposited on the workpiece in the one soldering work.

(8) The determination part 415 determines that the predetermined criterion is satisfied when a solder amount is smaller than a lower limit solder amount represented by the criterion information or larger than an upper limit solder amount represented by the criterion information. According to the determination (8), it is possible to determine that the amount of solder deposited on the workpiece may be excessive or deficient in the one soldering work.

When the monitor information is determined to satisfy the predetermined criterion in the one soldering work in step S301 (YES in step S301), the display control part 412*b* changes the display mode for the monitor information in the one soldering work that is determined to satisfy the predetermined criterion in step S301 (Step S302). Thereafter, the flow proceeds to step S203.

Conversely, when the monitor information in the one soldering work is determined not to satisfy the predetermined criterion in step S301 (NO in step S301), the flow proceeds to step S203.

When the work position currently applied with the marker is determined as the final work position in step S203 (YES in step S203), the flow proceeds to step 108. Conversely, when the work position currently applied with the marker is not determined as the final work position in step S203 (NO in step S203), the flow proceeds to step 201.

(Exemplary Manipulation Screen Image)

Figure 13:
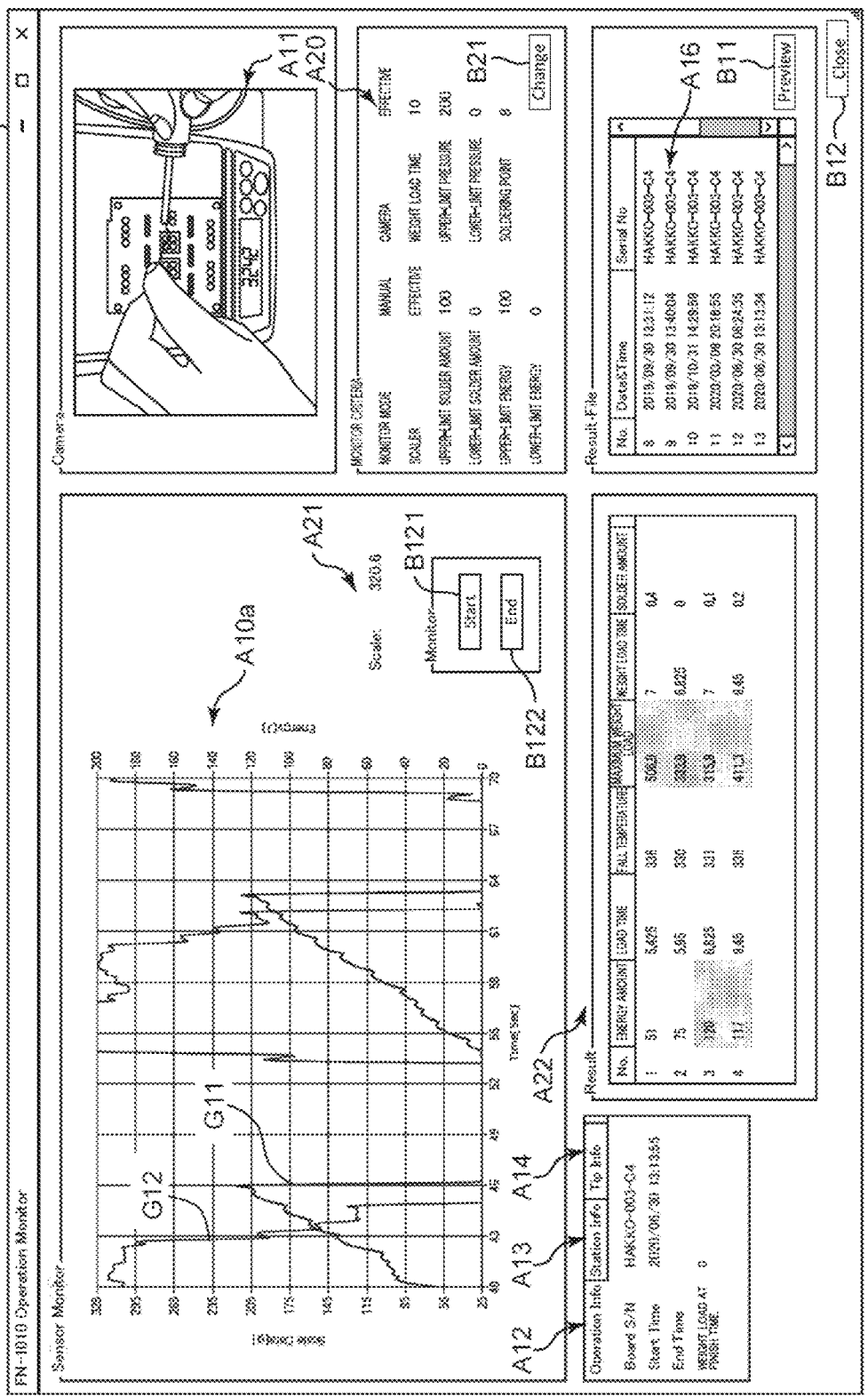
FIG. 13 shows another exemplary manipulation screen image displayed in the work management operation.

Furthermore, a manipulation screen image W1*a* to be displayed on the display part 408 in a work management operation in the third embodiment will be described. FIG. 13 shows the manipulation screen image W1*a* displayed in the work management operation as another example of the manipulation screen image. As shown in FIG. 13, the manipulation screen image W1*a* includes display sections A11 to A14 and A16, a start button B121, an end button B122, a preview button B11, and a closing button B12 in the same manner as the manipulation screen image W1 (FIG. 6), and further includes a display section A10*a* corresponding to the display section A10 and display sections A20 to A22 for various kinds of information.

The display control part 412*b* displays only one display section selected from the three display sections A12, A13, A14 on the manipulation screen image W1*a* through a manipulation to the input part 406 by a worker.

The display section A10*a* shows the monitor information being chronologically continuous. The display section A10*a* is in the form of a two-dimensional coordinate having a horizontal axis defining a date and time, a left vertical axis defining a load to be measured by the scaler included in the switch-attached jig 930*b*, and a right vertical axis defining a heat load (thermal energy) applied to a workpiece and solder.

The display control part 412*b* displays, in the display section A10*a*, a graph G11 showing a chronological change in the heat load, as in the display section A10 of the manipulation screen image W1 (FIG. 6). The display control part 412*b* sequentially and chronologically refers to pieces of weight load information acquired in a period from step S107 to step S108 where the soldering works to be manually performed on the board W are determined to have been finished. The display control part 412*b* displays, in the display section A10*a*, dots each at a position where a measurement date and time of a weight load represented by the weight load information having been referred to and the weight load meet. The display control part 412*b* displays a line obtained by connecting the displayed dots. Consequently, the display control part 412*b* displays, in the display section A10*a*, a graph G12 showing a chronological change in the weight load.

The display section A20 shows information about an environment for each of the soldering works on the board W and information about a criterion for the soldering work.

Specifically, when displaying the manipulation screen image W1*a* in step S100 concerning the display section A20, the display control part 412*b* displays, in the row "monitor mode", a "manual operation" representing an input of an instruction of starting the soldering work through a manipulation to the input part 406 by the worker, displays, in the row "camera", an "effective" state allowing the camera 920 to execute image-capturing for the entirety of the board W in the soldering work, and displays, in the row "scaler", an "effective" state allowing the scaler included in the switch-attached jig 930 to measure the weight load applied to the mount surface of the board W in the soldering work.

When acquiring the board information in step S103, the display control part 412*b* displays, in the display section A20, criterion information stored in the storage part 404*b* in association with the identification information of the board W contained in the board information.

FIG. 13 exemplary shows the display section A20 including the rows "upper limit solder amount", "lower limit solder amount", "upper limit energy", "lower limit energy", "weight load time", "upper limit pressure", "lower limit pressure", and "soldering point number" for respectively displaying an upper limit solder amount (100), a lower limit solder amount (0), an upper limit energy amount (100), a lower limit energy amount (0), an upper limit weight load time (10), an upper limit pressure (200), a lower limit pressure (0), and a soldering point number (8), each being represented by the acquired criterion information.

The display section A20 is provided with a change button B21. When the change button B21 is pushed downward through a manipulation to the input part 406 by the worker, a change manipulation screen image is displayed for the information displayed in the display section A20 and the criterion information stored in the storage part 404b in association with the identification information of the board W contained in the board information acquired in step S103.

The display control part 412b updates, on the change manipulation screen image, the information displayed in the display section A20 with the information changed through the manipulation to the input part 406 by the worker. When the criterion information is changed on the change manipulation screen image, the storage control part 411 updates, with the changed criterion information, the criterion information stored in the storage part 404b in association with the identification information of the board W contained in the board information acquired in step S103.

The display section A21 shows the monitor information being chronologically continuous as acquired from the switch-attached jig 930.

Specifically, the display control part 412b displays, in the display section A21, a weight load (e.g., 320.6) represented by the weight load information and applied to the mount surface of the board W, at each time of acquisition of the weight load information, during the period from step S107 (FIG. 12) to step S108 where the soldering works to be manually performed on the board W are determined to have been finished.

The display section A22 shows the monitor information in each of the soldering works on the board W.

Specifically, in step S202 (FIG. 12), the display control part 412b displays, at each time one soldering work is determined to have been finished, the monitor information in the one soldering work in the display section A22. The display control part 412b changes a display mode for the monitor information in the one soldering work determined to satisfy the predetermined criterion in step S301 (FIG. 12).

FIG. 13 exemplarily shows, in the display section A22, an energy amount (51), a load time (5.425), a fall speed (338), a maximum weight load (506.9), a weight load time (7), and a solder amount (0.4), as monitor information in a first soldering work. The display control part 412b exemplarily changes a display mode for the maximum weight load (506.9) in the first soldering work determined as satisfying the predetermined criterion in step S301 (FIG. 12).

(Modifications)

It should be noted that each of the embodiments described above shows only an example of the embodiment according to the present disclosure, and does not intend to delimit the present invention to the embodiments described above. For instance, the following modifications may be covered.

(1) Each of the work management systems 1, 1a, 1b in the first to third embodiments may further include a determination device, such as a footwear tester and a wrist strap tester, for determining whether an amount of static electricity accumulated in the worker indicates a predetermined amount or more. The determination device may be connectable to each of the work management apparatuses 10, 10a, 10b via a wired or wireless communication so that each of the controllers 410, 410a, 410b acquires a result of the determination by the determination device before execution of a work management operation. Each of the controllers 410, 410a, 410b may be configured not to perform the work management operation when the result of the determination indicates the predetermined amount or more. This configuration can avoid a risk of damaging an electronic component on the board W due to an electric current flowing to the electronic component from a worker with a predetermined amount of the static electricity or more when the worker performs a soldering work.

(2) Before execution of the work management operation by each of the work management systems 1a, 1b in the second embodiment and the third embodiment, each of the controllers 410a, 410b may acquire weight load information from the scaler included in the switch-attached jig 930. When the weight load applied to the mount surface of the board W represented by the weight load information acquired by each of the controllers 410a, 410 before the execution of the work management operation is smaller than the sum of the weight of the board W and the gross weight of the electronic component to be attached in the soldering works on the board W, each of the controllers 410a, 410b may not execute the work management operation. This configuration can avoid, in advance, performing a soldering work to a board W which is unprepared for the soldering.

(3) When the soldering works on the board W are determined to have been finished in step S108 (FIG. 12) in the third embodiment (YES in step S108), the controller 410b may determine whether the number of positions where the soldering works have been performed is correct. When the number of positions where the soldering works have been performed is determined as incorrect, the display control part 412b may cause the display part 408 to display a warning message indicating that the number of positions where the soldering works have been performed is incorrect.

Specifically, when the soldering works on the board W are determined to have been finished in step S108 (FIG. 12), the controller 410b may acquire the criterion information stored in the storage part 404 in association with the identification information of the board W contained in the board information acquired in step S103. The controller 410b then may determine whether the soldering point number represented by the acquired criterion information matches the number of determinations that the one soldering works have been finished in step S202. This configuration can make the worker realize a possible incorrect number of soldering works on the board W before delivery of the board W.

(4) The predetermined criterion used in step S301 (FIG. 12) in the third embodiment may be defined by using the monitor information stored in the storage part 404b (FIG. 11) in association with identification information of a board of a same kind having a same configuration as the board W in a soldering work having a same content as the one soldering work.

Specifically, in a case where an expert of soldering works uses the work management system 1b to manually perform a plurality of soldering works on a specific board W, step S109 in a work management operation is executed for storing monitor information and captured image information in the storage part 404b in association with the identification information of the board W.

Thereafter, an apprentice of soldering works uses the work management system 1b to manually perform a plurality of soldering works on a board of a same kind having a same configuration as the board W on which the expert has performed the soldering works. In this case, the determination part 415 may operate as follows in step S301 in the work management operation.

Specifically, the determination part 415 refers to the monitor information stored in the storage part 404b in association with the identification information of the board Won which the expert has performed the soldering works, and acquires, from among the monitor information having been referred to, monitor information in one soldering work in the same work order as that of one soldering work determined to have been finished in step S202. In this manner, the determination part 415 acquires the monitor information in the soldering work having the same content as the one soldering work determined to have been finished in step S202.

Moreover, the determination part 415 calculates a coincidence degree between one or more pieces of exemplar information (e.g., an energy amount, a maximum weight load) represented by the acquired monitor information in the soldering work having the same content and one or more pieces of target information (e.g., an energy amount, a maximum weight load) represented by the monitor information in the one soldering work determined to have been finished in step S202. The determination part 415 determines that the predetermined criterion is satisfied when the calculated coincidence degree exceeds a predetermined degree. The majority of the one or more pieces of the exemplar information coincide with the one or more pieces of target information within a predetermined margin of error, the determination part 415 determines that the predetermined criterion is satisfied by regarding the coincidence degree as exceeding the predetermined degree.

Alternatively, the determination part 415 acquires heat load information stored in the storage part 404b in association with the identification information of the board Won which the expert has performed the soldering works. The determination part 415 may determine that the predetermined criterion is satisfied when a coincidence degree between a shape of a graph G11 (FIG. 6) showing a chronological change in a heat load represented by the heat load information acquired in the one soldering work determined to have been finished in step S202 and a shape of a graph G11 (FIG. 6) showing a chronological change in a heat load represented by heat load information, among the acquired heat load information, acquired in one soldering work in the same order as that of the one soldering work determined to have been finished in step S202 exceeds the predetermined degree. Similarly, the determination part 415 may determine whether the predetermined criterion is satisfied with reference to a coincidence degree in shapes of graphs each showing a chronological change in the temperature of the tool tip 221 represented by tool tip temperature information or the weight load represented by the weight load information.

(5) In the third embodiment, the controller 410b may cause the soldering tool control device 100 to finish the temperature control for the tool tip 221 so that the flow proceeds to step S109 and the subsequent steps at a time when it is determined that the predetermined criterion is satisfied in step S301 (FIG. 12). In this manner, the remaining soldering works on the board W may be forcibly finished. In a case where one or more soldering works on the board W have already failed, this configuration can avoid wasteful performance of the remaining soldering works.

(6) Manual soldering works include a work of once melting a small amount of solder and applying the small amount of solder evenly onto a workpiece, and thereafter further replenishing solder. In this case, in one soldering work, a heat load reaches 0 in the middle of the work, and as a result, a waveform in a mount shape showing a chronological change in the heat load in the melting of the small amount of solder and a waveform in a mount shape showing a chronological change in a heat load in melting solder to be actually deposited on the workpiece stop continuing. Moreover, the waveform in a mount shape showing the chronological change in the heat load stops continuing when the tool tip 221 is cleaned in the one soldering work as well. Therefore, the determination way in step S202 as described in each of the second embodiment and the third embodiment may face a risk of a wrong determination that the one soldering work has been finished.

To avoid the wrong determination, the marker control part 414 may further determine, in step S202 in each of the second embodiment and the third embodiment, whether a difference between an initial weight load and a weight load represented by weight load information acquired at the finish time of the waveform in the mount shape showing the chronological change in the heat load is equal to or less than a predetermined amount. The marker control part 414 may be configured not to determine that the one soldering work has been finished when the difference is equal to or less than the predetermined amount, but to determine that the one soldering work has been finished when the difference is more than the predetermined amount, at the finish time of the waveform in the mount shape showing the chronological change in the heat load.

(7) Step S102 (FIG. 5, FIG. 9, FIG. 12) is excludable in the first to third embodiments. Accordingly, in step S109, the storage control part 411 may not cause each of the storage parts 404, 404a, 404b to store the identification information of the worker acquired in step S101. In this case, in step S112, each of the display control parts 412, 412b may not cause the display part 408 to display the identification information of the worker because of no acquisition of the identification information of the worker.

The present disclosure discloses various aspects of technologies as described above. Main technologies among them will be summarized below.

A work management apparatus according to one aspect is a work management apparatus for managing a plurality of soldering works to be manually performed on a board. The work management apparatus includes: a first interface part for connecting an identification information acquisition device which acquires identification information of the board; a second interface part for connecting an image-capturing device which generates an image; and a third interface part for connecting a soldering monitor device which generates monitor information about the soldering works; a storage part for storing, in association with the identification information of the board acquired by the identification information acquisition device connected to the first interface part, captured images of an entirety of the board continuously and chronologically generated by the image-capturing device connected to the second interface part in the soldering works, and the monitor information continuously and chronologically generated by the soldering monitor device connected to the third interface part in the soldering works; a selection part for receiving a selection of one piece of identification information from among the identification information of the board stored in the storage part; and a display part for chronologically displaying each of the captured images and the monitor information stored in the storage part in association with the one piece of identification information in a state where a capturing date and time of the captured image and an acquisition date and time of the monitor information match.

A work management method according to a second aspect is a work management method for use in a work management apparatus for managing a plurality of soldering works to be manually performed on a board. The work management apparatus includes: a first interface part for connecting an identification information acquisition device which acquires identification information of the board; a second interface part for connecting an image-capturing device which generates an image; and a third interface part for connecting a soldering monitor device which generates monitor information about the soldering works. The work management method includes: storing, in association with the identification information of the board acquired by the identification information acquisition device connected to the first interface part, captured images of an entirety of the board continuously and chronologically generated by the image-capturing device connected to the second interface part in the soldering works, and the monitor information continuously and chronologically generated by the soldering monitor device connected to the third interface part in the soldering works; receiving a selection of one piece of identification information from among the stored identification information of the board; and chronologically displaying each of the captured images and monitor information stored in association with the one piece of identification information in a state where a capturing date and time of the captured image and an acquisition date and time of the monitor information match.

A control program according to a third aspect is a control program for a computer included in a work management apparatus for managing a plurality of soldering works to be manually performed on a board. The work management apparatus includes: a first interface part for connecting an identification information acquisition device which acquires identification information of the board; a second interface part for connecting an image-capturing device which generates an image; and a third interface part for connecting a soldering monitor device which generates monitor information about the soldering works. The control program causes the computer to serve as: a storage part for storing, in association with the identification information of the board acquired by the identification information acquisition device connected to the first interface part, captured images of an entirety of the board continuously and chronologically generated by the image-capturing device connected to the second interface in the soldering works, and the monitor information continuously and chronologically generated by the soldering monitor device connected to the third interface part in the soldering works; a selection part for receiving a selection of one piece of identification information from among the identification information of the board stored in the storage part; and a display part for chronologically displaying each of the captured images and the monitor information stored in the storage part in association with the one piece of identification information in a state where a capturing date and time of the captured image and an acquisition date and time of the monitor information match.

According to the work management apparatus, the work management method, and the control program each having the above-described configuration, when the plurality of soldering works is manually performed on the board, the captured images of the entirety of the board continuously and chronologically generated by the image-capturing device in the soldering works, and the monitor information continuously and chronologically generated by the soldering monitor device in the soldering works are stored in association with the identification information of the board acquired by the identification information acquisition device.

When the selection of the one piece of identification information from among the stored identification information of the board is received in the above-described manner, each of the captured images and the monitor information associated with the one piece of the identification information is chronologically displayed in the state where the capturing date and time of the captured image and the acquisition date and time of the monitor information match.

Hence, a user of the work management apparatus can chronologically grasp a work position of each of the soldering works on the board corresponding to the selected one piece of identification information, and appropriately grasp the monitor information about each of the soldering works performed at each work position, with reference to the displayed captured image and the monitor information. Consequently, the work management apparatus, the work management method, and the control program each having the above-described configuration can improve the traceability of the soldering works manually performed on the board from the viewpoint of the grasp of the work position of each of the soldering works manually performed on the board.

The work management apparatus may further include: a fourth interface part for connecting a worker information acquisition device which acquires identification information of a worker who performs the soldering works. The storage part may further store, in association with the identification information of the board acquired by the identification information acquisition device connected to the first interface part, the identification information of the worker acquired by the worker information acquisition device connected to the fourth interface part, and the display part may further display the identification information of the worker stored in association with the one piece of identification information.

According to this configuration, when the soldering works are manually performed on the board, the identification information of the worker who performs the soldering works as acquired by the worker information acquisition device is further stored in association with the identification information of the board acquired by the identification information acquisition device. When the selection of the one piece of identification information from among the stored identification information of the board is received, the identification information of the worker associated with the one piece of identification information is further displayed.

Hence, the user of the work management apparatus can grasp the worker having performed the soldering works on the board in association with the selected one piece of identification information, with reference to the displayed identification information of the worker. This configuration accordingly can further improve the traceability of the soldering works manually performed on the board from the viewpoint of the grasp of the worker having manually performed the soldering works on the board.

The work management apparatus may further include: a second storage part for storing, in association with the identification information of the board, a plurality of pieces of work position information each representing a work position of each of the soldering works on the board in a work order in advance; and a fifth interface part for reading out work position information representing a work position of a subsequent soldering work from among the work position information, and instructing a marker device, which applies a marker indicating a work position of a soldering work onto the board, to apply a marker indicating the work position represented by the work position information having been read out onto the board.

According to the configuration, the work position information representing the work position of the subsequent soldering work is read out from among the pieces of work position information stored in advance in association with the identification information of the board, and the marker is applied at the work position represented by the read work position information. This can guide the worker to the work position of the subsequent soldering work. As a result, the worker can perform the subsequent soldering work at the guided appropriate work position.

The work management apparatus may further include: a determination part for determining, at each time one soldering work among the soldering works is finished, whether the monitor information continuously and chronologically generated by the soldering monitor device connected to the third interface part in the one soldering work satisfies a predetermined criterion. The display part may change a display mode for the monitor information when the determination part determines that the monitor information in the one soldering work satisfies the predetermined criterion.

According to this configuration, at each time one soldering work is finished, the monitor information in the one soldering work is determined whether to satisfy the predetermined criterion. When the monitor information is determined to satisfy the predetermined criterion, the display mode for the monitor information is changed.

Therefore, when the display mode for the monitor information acquired in the one soldering work is changed at a finish time of the one soldering work, the worker can easily grasp that the monitor information acquired in the one soldering work satisfies the predetermined criterion.

In the work management apparatus, the predetermined criterion may be defined by using the monitor information stored in the storage part in association with identification information of a board of a same kind having a same configuration as the board in a soldering work having a same content as the one soldering work.

According to this configuration, the monitor information in the one soldering work on the board is determined whether to satisfy the predetermined criterion defined by using the monitor information stored in the storage part in a soldering work having a same content on a board of a same kind. In this respect, the configuration is available for soldering work education.

For instance, the predetermined criterion is defined such that a coincidence degree between monitor information acquired in one soldering work on a board and monitor information acquired in a certain soldering work performed by a teacher, having a same content as the one soldering work on a board of a same kind as the board, and stored in the storage part is less than a predetermined value. In this case, when the display mode for the monitor information acquired in the one soldering work is changed at a finish time of the one soldering work performed by the worker, the worker can easily grasp a significant difference between the content in the one soldering work and the content of the work performed by the teacher on the board of the same kind.

In the work management apparatus, the monitor information may include at least one of: an amount of electric power supplied to a soldering tool used in a specific soldering work during an operation; a temperature of the soldering tool; a maximum weight load applied to the board in the soldering work during the operation; a sum of times in which a weight load is applied to the board in the soldering work during the operation; an amount of solder deposited on the board in the soldering work during the operation; a sum of times in which the electric power is supplied to the soldering tool in the soldering work in the operation; and a lowest temperature of the soldering tool in the soldering work during the operation.

In this configuration, the monitor information includes at least one of: an amount of electric power supplied to a soldering tool used in a specific soldering work during an operation; a temperature of the soldering tool; a maximum weight load applied to the board in the soldering work during the operation; a sum of times in which a weight load is applied to the board in the soldering work during the operation; an amount of solder deposited on the board in the soldering work during the operation; a sum of times in which the electric power is supplied to the soldering tool in the soldering work in the operation; and a lowest temperature of the soldering tool in the soldering work during the operation.

Accordingly, the user having referred to the monitor information can appropriately grasp, in the soldering work on the board corresponding to the selected one piece of identification information, at least one of: an amount of electric power supplied to the soldering tool; a temperature of the soldering tool; a maximum weight load applied to the board; a sum of times in which a weight load is applied to the board; an amount of solder deposited on the board; a sum of times in which the electric power is supplied to the soldering tool; and a lowest temperature of the soldering tool.

What is claimed is:

1. A work management apparatus for managing a plurality of soldering works to be manually performed on a board, the work management apparatus comprising:
   a first interface configured to connect an identification information acquisition device which acquires identification information of the board;
   a second interface configured to connect an image-capturing device which generates an image;
   a third interface configured to connect a soldering monitor device which generates monitor information about the soldering works;
   a first storage configured to store, in association with the identification information of the board acquired by the identification information acquisition device connected to the first interface, captured images of an entirety of the board continuously and chronologically generated by the image-capturing device connected to the second interface in the soldering works, and the monitor information continuously and chronologically generated by the soldering monitor device connected to the third interface in the soldering works;
   a selection receiver configured to receive a selection of one piece of identification information from among the identification of the board stored in the first storage; and
   a display configured to chronologically display each of the captured images and the monitor information stored in the first storage in association with the one piece of identification information in a state where a capturing date and time of the captured image and an acquisition date and time of the monitor information match.

2. The work management apparatus according to claim 1, further comprising:
   a fourth interface configured to connect a worker information acquisition device which acquires identification information of a worker who performs the soldering works, wherein
   the first storage further stores, in association with the identification information of the board acquired by the identification information acquisition device connected to the first interface, the identification information of the worker acquired by the worker information acquisition device connected to the fourth interface, and the display further displays the identification information of the worker stored in association with the one piece of identification information.

3. The work management apparatus according to claim 1, further comprising:

a second storage configured to store, in association with the identification information of the board, a plurality of pieces of work position information each representing a work position of each of the soldering works on the board in a work order in advance; and a fifth interface configured to read out work position information representing a work position of a subsequent soldering work from among the work position information, and instructing a marker device, which applies a marker indicating a work position of a soldering work onto the board, to apply a marker indicating the work position represented by the work position information having been read out onto the board.

4. The work management apparatus according to claim 1, further comprising:

a processor configured to determine, at each time one soldering work among the soldering works is finished, whether the monitor information continuously and chronologically generated by the soldering monitor device connected to the third interface in the one soldering work satisfies a predetermined criterion, wherein the display changes a display mode for the monitor information when the processor determines that the monitor information in the one soldering work satisfies the predetermined criterion.

5. The work management apparatus according to claim 4, wherein the predetermined criterion is defined by using the monitor information stored in the first storage in association with identification information of a board of a same kind having a same configuration as the board in a soldering work having a same content as the one soldering work.

6. The work management apparatus according to claim 1, wherein the monitor information includes at least one of:
an amount of electric power supplied to a soldering tool used in a specific soldering work during an operation;
a temperature of the soldering tool;
a maximum weight load applied to the board in the soldering work during the operation;
a sum of times in which a weight load is applied to the board in the soldering work during the operation;
an amount of solder deposited on the board in the soldering work during the operation;
a sum of times in which the electric power is supplied to the soldering tool in the soldering work in the operation; and
a lowest temperature of the soldering tool in the soldering work during the operation.

7. The work management apparatus according to claim 1, wherein the monitor information includes an amount of electric power supplied to a soldering tool used in a specific soldering work during an operation.

8. The work management apparatus according to claim 1, wherein the monitor information includes a temperature of the soldering tool.

9. The work management apparatus according to claim 1, wherein the monitor information includes a maximum weight load applied to the board in the soldering work during the operation.

10. The work management apparatus according to claim 1, wherein the monitor information includes a sum of times in which a weight load is applied to the board in the soldering work during the operation.

11. The work management apparatus according to claim 1, wherein the monitor information includes an amount of solder deposited on the board in the soldering work during the operation.

12. The work management apparatus according to claim 1, wherein the monitor information includes a sum of times in which the electric power is supplied to the soldering tool in the soldering work in the operation.

13. The work management apparatus according to claim 1, wherein the monitor information includes a lowest temperature of the soldering tool in the soldering work during the operation.

14. A work management method for use in a work management apparatus for managing a plurality of soldering works to be manually performed on a board, wherein the work management apparatus includes:
a first interface configured to connect an identification information acquisition device which acquires identification information of the board;
a second interface configured to connect an image-capturing device which generates an image; and
a third interface configured to connect a soldering monitor device which generates monitor information about the soldering works, and the work management method comprises:
storing, in association with the identification information of the board acquired by the identification information acquisition device connected to the first interface, captured images of an entirety of the board continuously and chronologically generated by the image-capturing device connected to the second interface in the soldering works, and the monitor information continuously and chronologically generated by the soldering monitor device connected to the third interface in the soldering works;
receiving a selection of one piece of identification information from among the stored identification information of the board; and
chronologically displaying each of the captured images and the monitor information stored in association with the one piece of identification information in a state where a capturing date and time of the captured image and an acquisition date and time of the monitor information match.

15. A non-transitory computer-readable storage medium storing a control program for a computer included in a work management apparatus for managing a plurality of soldering works to be manually performed on a board, wherein the working management apparatus includes:
a first interface configured to connect an identification information acquisition device which acquires identification information of the board;
a second interface configured to connect an image-capturing device which generates an image; and
a third interface configured to connect a soldering monitor device which generates monitor information about the soldering works, and the control program causes the computer to serve as:
- a storage configured to store, in association with the identification information of the board acquired by the identification information acquisition device connected to the first interface, captured images of an entirety of the board continuously and chronologically generated by the image-capturing device connected to the second interface in the soldering works, and the monitor information continuously and chronologically generated by the soldering monitor device connected to the third interface in the soldering works;
- a selection receiver configured to receive a selection of one piece of identification information from among the identification information of the board stored in the storage; and
- a display configured to chronologically display each of the captured images and the monitor information stored in the storage in association with the one piece of identification information in a state where a capturing date and time of the captured image and an acquisition date and time of the monitor information match.

\* \* \* \* \*